US 8,592,856 B2

(12) United States Patent
Salam

(10) Patent No.: US 8,592,856 B2
(45) Date of Patent: Nov. 26, 2013

(54) LED LAMPS

(75) Inventor: Hassan P. A. Salam, London (GB)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/617,715

(22) Filed: Sep. 14, 2012

(65) Prior Publication Data

US 2013/0009186 A1    Jan. 10, 2013

Related U.S. Application Data

(60) Division of application No. 13/064,899, filed on Apr. 25, 2011, now Pat. No. 8,399,903, which is a continuation of application No. 11/475,021, filed on Jun. 27, 2006, now Pat. No. 7,947,998, which is a continuation of application No. 10/678,174, filed on Oct. 6, 2003, now abandoned, which is a continuation of application No. 09/820,912, filed on Mar. 30, 2001, now Pat. No. 6,633,120, which is a continuation-in-part of application No. 09/549,575, filed on Apr. 14, 2000, now abandoned, which is a continuation-in-part of application No. 09/196,358, filed on Nov. 19, 1998, now Pat. No. 6,346,771.

(30) Foreign Application Priority Data

Nov. 19, 1997  (GB) .................... 9724507.0
Sep. 17, 1998  (GB) .................... 9820311.0
Apr. 15, 1999  (GB) .................... 9908565.6
Oct. 28, 1999  (GB) .................... 9925573.9
Feb. 15, 2000  (GB) .................... 0003534.5

(51) Int. Cl.
      *H01L 33/00*    (2010.01)

(52) U.S. Cl.
      USPC .................. 257/99; 257/94; 257/E33.062

(58) Field of Classification Search
      USPC ................... 257/94, 99, E33.062
      See application file for complete search history.

(56) References Cited

U.S. PATENT DOCUMENTS

| 3,290,539 A | 12/1966 | Lamorte |
| 3,443,140 A | 5/1969 | Ing, Jr. et al. |
| 3,900,863 A | 8/1975 | Kim |
| 4,053,914 A | 10/1977 | Goodwin |

(Continued)

FOREIGN PATENT DOCUMENTS

| EP | 0 442 002 B1 | 8/1991 |
| EP | 0 559 455 A1 | 9/1993 |

(Continued)

OTHER PUBLICATIONS

Notification of Office Action for corresponding U.S. Appl. No. 13/570,022, dated May 23, 2013, pp. 1-19.

(Continued)

*Primary Examiner* — Jarrett Stark
(74) *Attorney, Agent, or Firm* — Ditthavong Mori & Steiner, P.C.

(57) ABSTRACT

A high power LED lamp has a GaN chip placed over an AlGaInP chip. A reflector is placed between the two chips. Each of the chips has trenches diverting light for output. The chip pair can be arranged to produce white light having a spectral distribution in the red to blue region that is close to that of daylight. Also, the chip pair can be used to provide an RGB lamp or a red-amber-green traffic lamp. The active regions of both chips can be less than 50 microns away from a heat sink.

20 Claims, 18 Drawing Sheets

(56) References Cited

U.S. PATENT DOCUMENTS

| | | |
|---|---|---|
| 4,163,953 A | 8/1979 | Springthorpe et al. |
| 4,186,410 A | 1/1980 | Cho et al. |
| 4,214,251 A | 7/1980 | Schairer |
| 4,225,380 A | 9/1980 | Wickens |
| 4,706,101 A | 11/1987 | Nakamura et al. |
| 4,730,331 A | 3/1988 | Burnham et al. |
| 4,820,013 A | 4/1989 | Fuse |
| 4,881,237 A | 11/1989 | Donnelly |
| 4,933,601 A | 6/1990 | Sagawa et al. |
| 5,003,357 A | 3/1991 | Kim et al. |
| 5,087,949 A | 2/1992 | Haitz |
| 5,113,232 A | 5/1992 | Itoh et al. |
| 5,146,465 A | 9/1992 | Khan et al. |
| 5,151,756 A | 9/1992 | Nettelbladt et al. |
| 5,283,447 A | 2/1994 | Olbright et al. |
| 5,300,788 A | 4/1994 | Fan et al. |
| 5,309,001 A | 5/1994 | Watanabe et al. |
| 5,563,422 A | 10/1996 | Nakamura et al. |
| 5,684,523 A | 11/1997 | Satoh et al. |
| 5,696,389 A | 12/1997 | Ishikawa et al. |
| 5,698,865 A | 12/1997 | Gerner et al. |
| 5,734,225 A | 3/1998 | Biebuyck et al. |
| 5,739,553 A | 4/1998 | Noto et al. |
| 5,744,828 A | 4/1998 | Nozaki et al. |
| 5,777,350 A | 7/1998 | Nakamura et al. |
| 5,779,924 A | 7/1998 | Krames et al. |
| 5,782,555 A | 7/1998 | Hochstein |
| 5,793,405 A | 8/1998 | Shakuda |
| 5,796,771 A | 8/1998 | DenBaars et al. |
| 5,889,295 A | 3/1999 | Rennie et al. |
| 5,905,275 A | 5/1999 | Nunoue et al. |
| 5,965,907 A | 10/1999 | Huang et al. |
| 5,977,566 A | 11/1999 | Okazaki et al. |
| 6,015,719 A | 1/2000 | Kish, Jr. et al. |
| 6,045,240 A | 4/2000 | Hochstein |
| 6,091,195 A | 7/2000 | Forrest et al. |
| 6,111,272 A | 8/2000 | Heinen |
| 6,229,160 B1 | 5/2001 | Krames et al. |
| 6,281,524 B1 | 8/2001 | Yamamoto et al. |
| 6,307,218 B1 | 10/2001 | Steigerwald et al. |
| 6,459,130 B1 | 10/2002 | Arndt et al. |
| 6,614,056 B1 | 9/2003 | Tarsa et al. |
| 7,947,998 B2 | 5/2011 | Salam |
| 2006/0237738 A1 | 10/2006 | Salam |

FOREIGN PATENT DOCUMENTS

| | | |
|---|---|---|
| EP | 0 727 829 A2 | 8/1996 |
| EP | 0 734 077 A1 | 9/1996 |
| GB | 2 296 378 A | 6/1996 |
| GB | 2 304 230 A | 3/1997 |
| GB | 2 311 413 A | 9/1997 |
| JP | 03-268360 A | 11/1991 |
| JP | 51-36085 A | 6/1993 |
| JP | 06-005922 A | 1/1994 |
| JP | 06-268252 A | 9/1994 |
| JP | 07-086640 A | 3/1995 |
| JP | 07-307489 A | 11/1995 |
| JP | 09-097922 A | 4/1997 |
| JP | 09-298310 A | 11/1997 |

OTHER PUBLICATIONS

Notification of Office Action for corresponding U.S. Appl. No. 13/331,871, dated Mar. 7, 2013, pp. 1-32.

English Translation of Office Action for related Japanese Patent Application No. 2010-113662, dated Mar. 13, 2012, pp. 1-4.

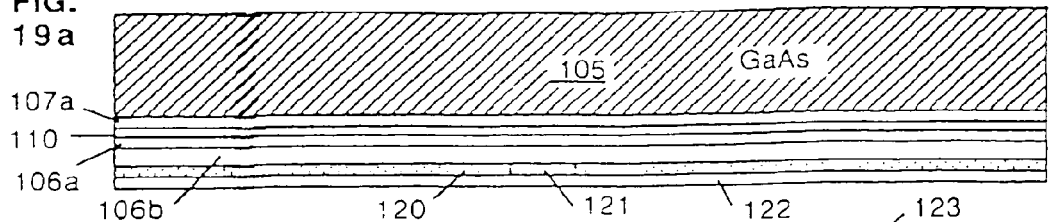
FIG. 19a
FIG. 19b
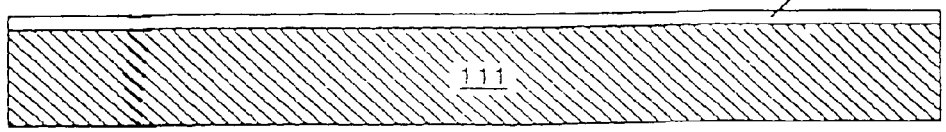
FIG. 19c
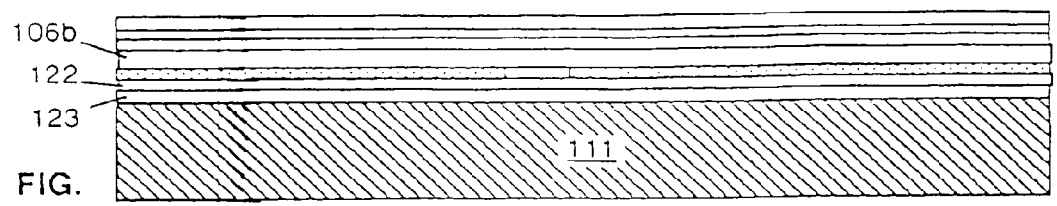
FIG. 19d
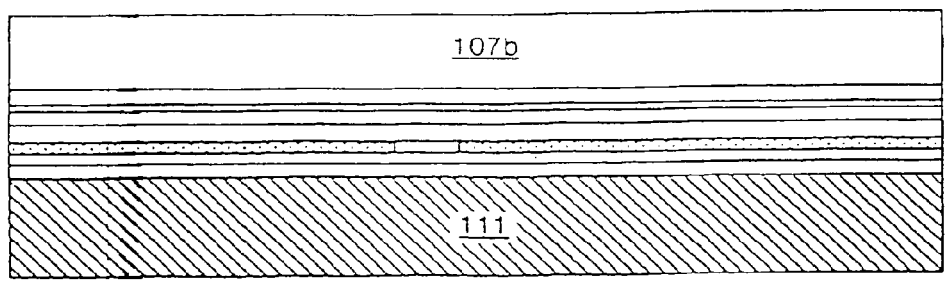
FIG. 19e

LED LAMPS

CROSS-REFERENCE TO RELATED APPLICATIONS

This application is a divisional application of U.S. patent application Ser. No. 13/064,899, filed Apr. 25, 2011 which is a continuation of application Ser. No. 11/475,021, filed Jun. 27, 2006, now U.S. Pat. No. 7,947,998, which was a continuation of application Ser. No. 10/678,174, filed Oct. 6, 2003, now abandoned, which was a continuation of application Ser. No. 09/820,912, filed Mar. 30, 2001, now U.S. Pat. No. 6,633, 120, which was a continuation-in-part of application Ser. No. 09/549,575, filed Apr 14, 2000, now abandoned, which was a continuation-in-part of application Ser. No. 09/196,358, filed Nov. 19, 1998, now U.S. Pat. No. 6,346,771.

FIELD AND BACKGROUND OF THE INVENTION

The present invention is related to colored and white LED lamps. A purpose of the present invention is to provide a single-chip LED lamp that is up to 250 times more powerful than a conventional single-chip LED lamp. Another purpose of the invention is to provide a two-chip white LED lamp that is up to 250 times more powerful than a conventional single-chip white LED lamp.

Existing single-chip LED lamps are generally of low input power, typically 40-150 milliwatts.

Designers of lamps for outdoor use have had the choice mainly of incandescent tungsten light sources, gas discharge light sources, and LED light sources. Designers of LED-based lamps requiring high power have had to resort to using clusters of single chip LED lamps, each of about 0.1 watt rating, wired in series or in parallel and housed together as a single lamp unit to achieve enhanced power. Providing a lamp unit by clustering single-chip LED lamps is very costly, since it involves making several single-chip lamps, housing them in a unit, wiring them up, and testing the final unit. U.S. Pat. Nos. 5,382,811 and 5,632,551 provide examples of cluster lamps.

Applications for high power LED colored lamps include outdoor displays, which usually have to operate in direct sunlight and so require powerful lamps, and vehicle lights and traffic lights. At present long-life LED traffic lights for use at street intersections need more than a hundred conventional single-chip LED lamps for each lamp unit. The need to use many LED lamps to provide a single LED traffic light is a disadvantage, particularly since only one tungsten light source is needed for a conventional traffic light.

Current blue-green LED traffic lights rely on gallium nitride (GaN) LED technology; whereas amber and red traffic lights rely on aluminum gallium indium phosphide (AlGaInP) technology. It is an object of this invention to provide high power single chip LED lamps in both of these technologies.

Applications for high power LED white lamps include vehicle headlights and reverse lights, vehicle internal lights, torches and other battery powered lighting devices. White single chip LED lamps are available, but they are typically of only about 0.1 watt, unless they are cluster lamps. Furthermore, they rely on a GaN chip that generates ultraviolet or blue light. All or most of this generated light energy has to be converted, using fluorescent material, into longer wavelength components to produce the white light. The light conversion results in loss of light energy. FIG. 31 illustrates the typical spectral distribution of the white light produced. This is quite different from the spectral distribution of daylight, which is represented by dotted line 437.

Prior art single-chip LED lamps having clear convergent lenses, used widely in outdoor displays, suffer not only from the fact that they are of low power but also from the fact that they project light that is not uniform. The non-uniformity is partly due to the bonding pad or pads on the chip top face, which are projected by the lamp as dark areas. The typical width of the bonding pad is about 30-40% of the width of the chip and this is large enough to interfere with achieving good uniformity of projected light even if the LED lens is defocussed relative to top face of the chip. For good quality image displays it is desirable to match the apparent brightnesses of the viewed lamps to within 5%. To achieve this it is important to reduce the non-uniformity caused by the bonding pads.

SUMMARY OF THE INVENTION

An object of the present invention is to provide a single-chip LED lamp that avoids or reduces the need for clustering.

A further object of the present invention is to provide a single chip LED lamp arranged so that light emitting portions of the chip are adjusted to be equalised in intensity.

A further object of the present invention is to provide a single chip LED lamp in which the sizes of the bonding pads relative to the size of the chip are reduced, so as to improve uniformity of light projected by a lensed lamp.

A further object of the present invention is to provide a single chip LED lamp, with input power in the region of 5-25 watts, that has low rise of the junction temperature when energised, thus prolonging the life of the lamp and reducing or eliminating the need for forced ventilation of the lamp.

A further object of the present invention is to provide a single chip LED lamp arranged so that light emitting portions of the chip that are faulty, by drawing more than their fair share of current, are starved of electrical power.

A further object of the present invention is to provide a single chip AlGaInP lamp of high power, avoiding the need for clustering lamps for an amber or red street traffic light.

A further object of the present invention is to provide an AlGaInP LED chip for an LED lamp that does not require a thick (and therefore costly) window layer, either above or below the active region, for efficient light extraction.

A further object of the present invention is to provide a white light lamp based on just two LEDs one of which has an AlGaInP active region.

A further object of the present invention is to provide a white light lamp having a spectral distribution close to that of daylight.

A further object of the present invention is to provide a high power RGB lamp that is based on two chips one of which has an AlGaInP active region.

According to an aspect of the invention an LED lamp includes an LED chip having a top face and comprising a substrate and semiconductor layers between the top face and the substrate, the semiconductor layers forming the core of a light guide extending parallel to the plane of the top face. The chip includes at least one cavity with light-emitting side walls that extends into at least one of the semiconductor layers. The chip converts guided light in the core into top light. According to another aspect of the invention guided light in the core is extracted with the aid of reflectors that are parallel to the semiconductor layers. According to yet another aspect of the invention metal tracks connected to the n-type semiconductor layer are provided that enhance the efficiency of the lamp.

According to another aspect of the invention an LED lamp includes a chip comprising at least two light emitters each having a triangular top face, the two emitters being separated by a trench.

According to another aspect of the invention a single chip LED lamp which can have input power of 5-25 watts includes an LED chip having a top face and comprising a substrate and semiconductor layers between the top face and the substrate, the semiconductor layers forming the core of a light guide extending parallel to the plane of the top face. The chip includes at least one trench, and a heat sink is attached to the top face of the chip that draws heat from the active region of the chip.

According to another aspect of the invention an LED lamp has an LED chip with a plurality of individually powered light emitting elements each provided with a fuse. This improves the yield of usable LED chips during manufacture.

According to another aspect of the invention there is provided an LED lamp comprising: an LED semiconductor core having a thickness and comprising a plurality of vertically stacked semiconductor layers; cavities in the core having side walls that divert light from the core; first and second reflectors that are below and above the core, respectively; each of the reflectors being reflective to light from the core that has an angle of incidence to the reflector of 60 degrees, the reflectors guiding light generated in the core towards the cavities; and the core being lattice-matched to GaAs and generating visible light.

According to another aspect of the invention a high power AlGaInP LED for a lamp is manufactured using the steps of: providing a member having a planar surface; providing a GaAs substrate on which an AlGaInP LED is epitaxially grown; providing an electrical terminal on the LED; joining the member to the LED; removing the GaAs substrate; and the method also including the step of providing an opening in the member positioned to be opposite said terminal. The steps are preferably carried out during wafer processing.

According to another aspect of the invention a high power AlGaInP LED for a lamp is manufactured using the steps of: providing an LED that is supported on and epitaxial with a GaAs substrate; providing a non-semiconductor substrate having lower and upper surfaces; joining the LED to the upper substrate surface using a medium having a melting temperature exceeding 300° C.; removing the GaAs substrate; providing an ohmic contact to the LED using a process that heats the LED to more than 300° C. and providing a surface between the LED and the lower substrate surface that is reflective to LED light incident to the surface at 60°. The steps are preferably carried out during wafer processing.

According to another aspect of the invention there is provided an LED white lamp comprising a vertical stack of just two LEDs one of which is of AlGaInP and the other of GaN (or InGaN). The AlGaInP LED generates light at very low cost per lumen compared with GaN. Thus the combination provides white light at a lower cost per lumen than a white lamp based entirely on GaN. Furthermore, the use of fluorescent material, which causes energy loss, can be avoided.

According to another aspect of the invention there is provided an LED white lamp comprising an LED in which the active region crystal lattice structure is based on several chemical elements and the ratio of one of the elements to another of them is altered during the crystal growth so as to broaden the spectral distribution of the light of the LED.

According to another aspect of the invention there is provided a high power variable color RGB lamp comprising a vertical LED stack of just two LED chips, one of which is of AlGaInP.

According to another aspect of the invention there is provided a lamp capable of generating white light, the lamp comprising a GaN chip having interleaved light emitting elements of differing colors.

BRIEF DESCRIPTION OF THE DRAWINGS

FIG. 19 illustrate a further method of producing an AlGaInP LED according to the invention.

FIG. 20b is an elevation view of the arrangement of FIG. 20a.

FIG. 21 illustrates production of white light by the arrangement of FIG. 20a

FIG. 22 illustrates layers of the arrangement of FIG. 20a

DESCRIPTION OF PREFERRED
EMBODIMENTS

Figure 1:
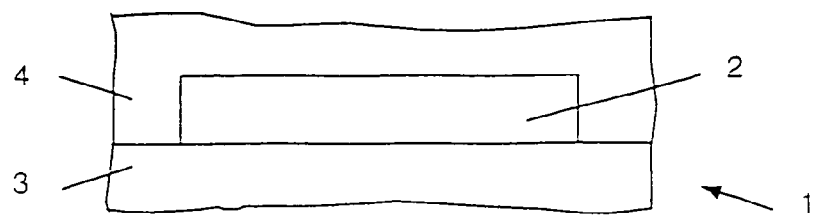
FIG. 1 illustrates in side view an LED light source according to an embodiment of the invention.
Figure 2:
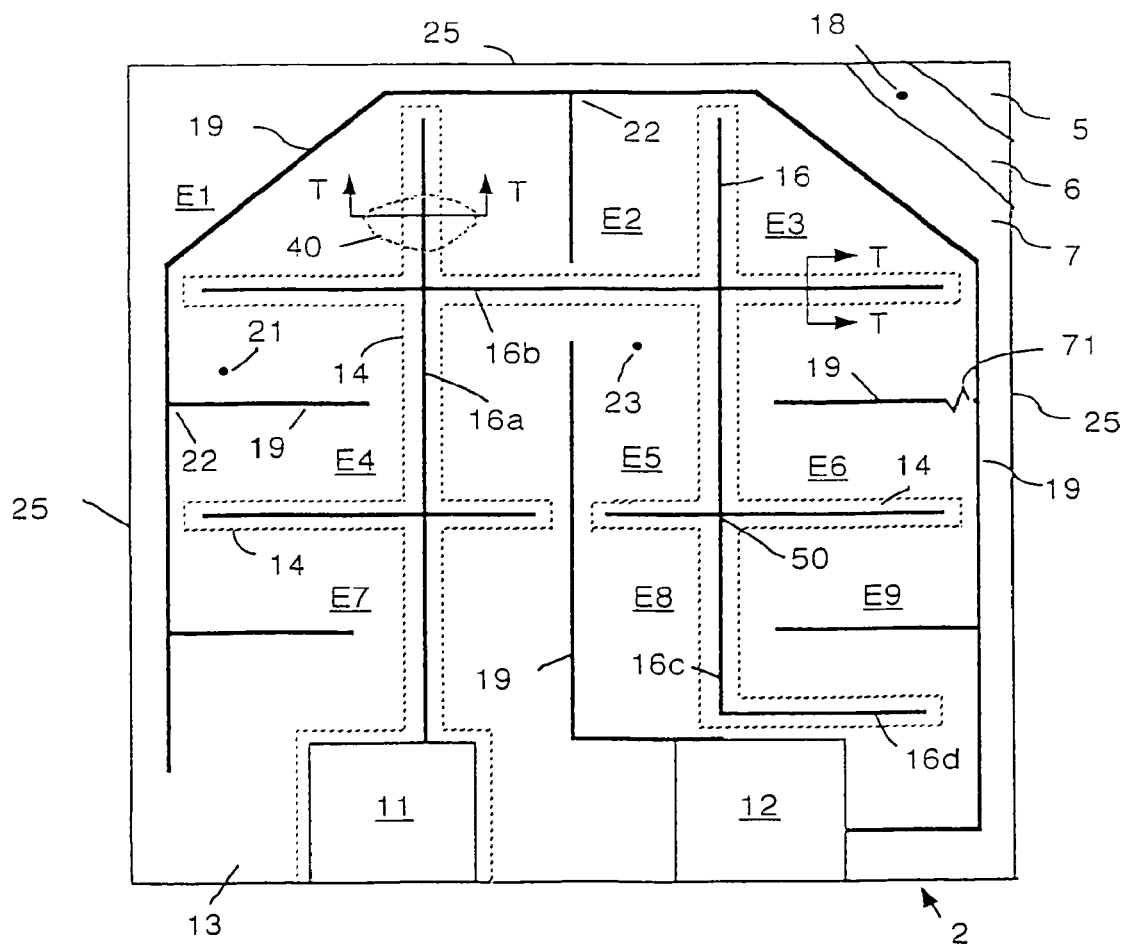
FIG. 2 is a plan view of the LED chip in FIG. 1.
Figure 3:
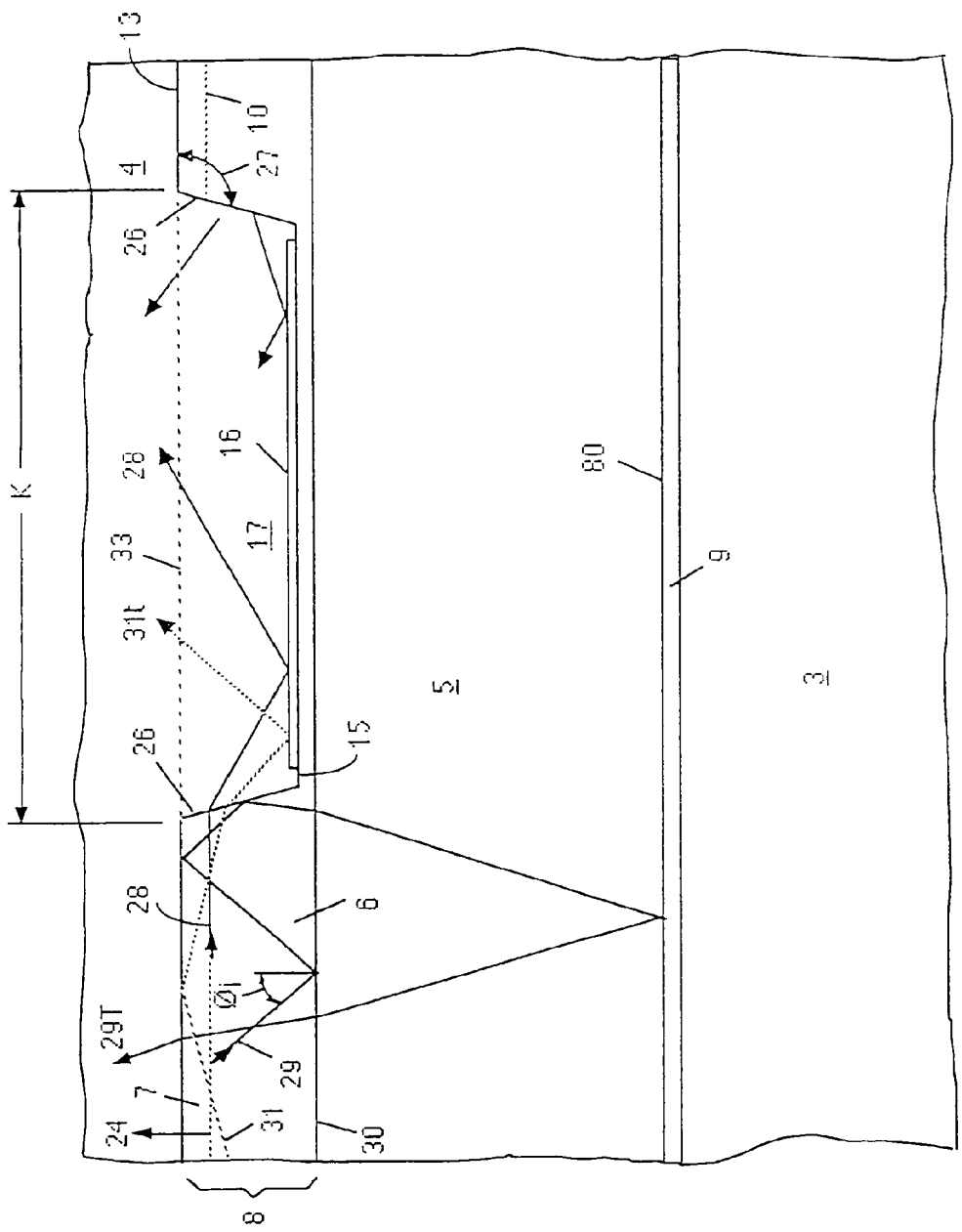
FIG. 3 is a sectional view of a portion of chip 2.

FIGS. 1-3 illustrate an improved LED light source according to an embodiment of the invention. Light source 1 comprises an LED chip 2 mounted on a metal support 3 which may be part of a reflective bowl the floor of which acts as a heat sink. Over chip 2 there is a cover 4 of transparent dielectric material. FIG. 3 is a sectional view taken along T-T of a portion 40 of chip 2.

Chip 2 comprises a transparent base 5 over which is formed a layer 6 of n-type semiconductor material. A layer 7 of p-type semiconductor material is formed over n-layer 6. Each of semiconductor layers 6, 7 can be less than 5 microns thick. Semiconductor layers 6, 7 are referred to collectively as semiconductor 8. Each of the basic n, p layers 6, 7 may include supplementary layers, not shown, that enhance the performance of the chip, or that simplify its manufacture. For example, p-layer 7 may include a thin light-passing gold layer on top of it to, in effect, enhance the electrical conductivity of the p-layer, and the n-layer may include a low resistivity semiconductor layer for enhancing electrical connection within the n-region of chip 2. Active region 10 may include a thin layer of active region material that enhances light generation or that determines the color of the light generated. The whole of the plane of the top of chip 2 up to side faces 25 constitutes a first major surface of chip 2. The lower surface 80 of substrate 5 constitutes a second major surface of chip 2. A reflector 9 is placed on the lower surface 80 of substrate 5. Reflector 9 can be a mirror coating of silver or aluminum.

Transparent cover material 4 has a refractive index $n_c$ that is greater than 1.25, and preferably greater than 1.4. Furthermore, $n_c$ is less than the refractive index $n_s$ of semiconductor 8. The value of $n_c$ is preferably such that $n_s$ is more than 20% higher, and more preferably more than 30%, higher than the value of $n_c$.

Transparent substrate 5 is chosen to be of a material having a refractive index $n_b$ that is at least 15%, and preferably at least 20%, less than the refractive index $n_s$ of semiconductor 8. The arrangement is such that semiconductor 8 together with media 5, 4, acts as a planar light guide, with the light being guided in semiconductor core 8.

Electrically connected to n-layer 6, by contact of its lower surface with n-layer 6, is a bonding pad terminal 11. Electrically connected to p-layer 7, by contact of its lower surface with p-layer 7, is a bonding pad terminal 12. Formed into top face 13 of chip 2, for example by etching, are elongate cavities or trenches 14. The cross-section T-T of trench 14 is illustrated in FIG. 3. Trench 14 has a floor portion 15 that is in the n-layer and that is parallel to chip top face 13. Joined to floor 15, and thereby electrically connected to the buried p-layer 6, is a metallic conductor track 16, comprising gold or other low resistivity metal. For chips generating green or blue light the track 16 preferably comprises metal of good reflectivity to green and blue light, such as aluminum.

Trench 14 is filled with transparent dielectric material 17 having a refractive index $n_t$ that is less than 80% of the refractive index of semiconductor 8. Material 17 is preferably of plastic, such as epoxy. Material 17 may be the same as translucent material 4, or it may be different. All conductors 16 are metallically connected to each other and to bonding pad terminal 11. Thus current from a point 18 in the buried n-layer can reach n-terminal 11 via conductors 16 that are near point 18, instead of only by passing through the whole length of the n-layer between point 18 and terminal 11.

By means of conductors 16, the voltage drop between bonding pad 11 and any point on the n-layer, such as 18, is reduced.

This increases the lumens-per-watt efficiency of the chip. Furthermore, the distribution of current and hence the generated light throughout the chip top is made more even.

Conductors 16 comprise meandering tracks. Thus, for example, conductors 16a, 16b together constitute a meandering track, i.e. a track that changes its direction. Conductors 16c, 16d constitute another meandering track. Conductor tracks 16 have node points 50 that join a plurality of tracks together. The width of conductor 16 can be 5-20 μm and its thickness can be 0.5 μm or more. Conductors 16 can be formed by the same process steps as are used for making pad 11, or by similar process steps.

Joined to the top of p-layer 7, and thereby electrically connected to p-layer 7, are electrical conductor tracks 19 shown only in FIG. 2, which may comprise gold or other metal. All conductors 19 are metallically connected to each other and to bonding pad terminal 12. Thus current applied to bonding pad 12 can reach a point 21 in p-layer 7 that is remote from bonding pad 12, mainly via conductors 19, instead of via the p-layer only. Conductor tracks 19 have node points 22 that join a plurality of tracks together. Conductors 19 can be formed by the same process steps as are used for making pad 12, or by similar process steps. The network of conductors 19 comprises meandering tracks.

By means of conductors 19, the voltage drop between bonding pad 12 and any point on the p-layer, such as 21, is reduced This increases the lumens-per-watt efficiency of the chip. Furthermore, the distribution of current and hence the generated light throughout the chip top is made more even.

Conductors 19 may be 1-50 μm wide, or more, and 0.2 to 2 μm thick. Because of their narrow width, dark lines produced by conductors 19 disappear when an image of light source 2 is projected by a defocussed lens. If the p-layer is such that it has a thin light-passing gold layer all over it, then, by incorporating conductors 19 to feed the p-layer, the thickness of the gold layer can be reduced, allowing more light to pass through the gold layer and, therefore, increasing the top light of the chip, while still maintaining low resistance connection to the p-layer.

A ray of light generated within the chip at a point 23 can have any one of many directions. If the direction of the ray is normal or nearly normal to top face 13 of the chip it passes out of the chip as top light 24. If the ray is parallel or nearly parallel to top face 13 of the chip it travels in semiconductor 8, which acts as a light guide core, until it meets a side exit face. In the arrangement of FIGS. 1-3, there are four outer side faces 25 of chip 2 and several supplementary side faces 26 provided by trenches 14. Supplementary side faces 26 allow light progressing sideways in semiconductor layers 6, 7 to escape from the chip without having to travel all the way to outer side faces 25. Because the sideways light trapped between media 4, 5 travels a shorter distance within semiconductor 8 before it escapes, it is attenuated less. This lower light attenuation facilitates making large, bright LED chips. Conductors 16, 19 result in lower electrical losses and so, also, facilitate making large, bright LED chips.

Light emanating from chip 2 is illustrated by various rays shown in FIG. 3. Each trench wall 26 forms an obtuse angle 27 with the part of top face 13 that adjoins the side wall and emits light. Obtuse angle 27 is preferably between 95 and 130 degrees, and more preferably between 110 and 120 degrees. Wall 26 may have a curved cross section. In this case angle 27 is measured between the plane tangential to the wall halfway up the height of the wall and top face 13.

The depth of trench 14 is preferably more than 50% of the thickness of semiconductor 8, so as to allow a large proportion of the light in semiconductor 8 approaching the trench to escape through trench wall 26. The thickness of the layer of n-type material under metal track 16 is preferably greater than 5% of the total thickness of the n-layer, so as to maintain good electrical connection between track 16 and the body of n-type semiconductor material either side of trench 14.

The paths of rays 28, 29 generated at the semiconductor active region 10 are illustrated in FIG. 3. Because the index of refraction $n_s$ of semiconductor 8 is higher than the index of refraction $n_t$ of cover material 4 and trench wall 26 forms an obtuse angle with chip top face 13, horizontal ray 28 hitting trench wall 26 is diverted downwards by refraction as it passes through wall 26. Ray 28 is then reflected upwards by reflector 16 to pass through aperture 33 of the trench. It is not only horizontal rays that will pass through trench wall 26. Rays that have been guided by multiple internal reflection in semiconductor 8 that hit wall 26 with a small angle of incidence will also pass through the wall, such as ray 31.

Ray 29 hitting interface 30 between semiconductor 8 and base 5 at an angle of incidence $\phi_i$ of 45 degrees is totally reflected at interface 30, as shown, and then again at interface 13. Ray 29 is propagated sideways by the previously mentioned light-guide property of layers 4, 8, 5. Total reflection of ray 29 at interface 30 occurs because the angle of incidence $\phi_i$ is greater than the critical angle $\phi_{csb}$ for total internal reflection at interface 30. The reflected ray 29 hits top surface 13 at 45 degrees, and it is again totally reflected, because the angle of incidence of ray 29 to top surface 13 is greater than the critical angle $\phi_{csc}$ for the interface between semiconductor 8 and cover material 4. Ray 29 then hits trench wall 26. At trench wall 26 ray 29 is yet again totally reflected. Total reflection of ray 29 occurs at surface 26 because its angle of incidence is greater than the critical angle $\phi_{cst}$ for the interface between semiconductor 8 and trench material 17. After being diverted by reflection by trench wall 26, ray 29 exits semiconductor 8 through interface 30. Ray 29 exits semiconductor 8 because it hits interface 30 at an angle of incidence that is less than the critical angle $\phi_{csb}$ for interface 30. Ray 29 is then reflected by reflector 9 upwards to exit through chip top face 13 as top light ray 29T.

Taking the case, for example, where:
Cover medium 4 and trench material 17 are both of epoxy having a refractive index of 1.5, i.e. $n_c=n_t=1.5$; Base 5 is sapphire having a refractive index of about 1.7, i.e. $n_b=1.7$;
Semiconductor 8 has a refractive index $n_s=3$
Obtuse angle 27 has a value $\phi_{27}=100°$
Then:

$$\phi_{csc}=\sin^{-1} n_c/n_s=\sin^{-1} 0.5=30°$$

$$\phi_{cst}=\sin^{-1} n_t/n_s=\sin^{-1} 0.5=30°$$

$$\phi_{csb}=\sin^{-1} n_b/n_s=\sin^{-1} 1.7/3=\sin^{-1} 0.567=34.5°.$$

After it is diverted by face 26, the angle of incidence of ray 29 to interface 30 is equal to: $45°-2(\phi_{27}-90°=25°$, which is less than $\phi_{csb}$. If $\phi_{27}$ is increased to 110° the angle of incidence of ray 29 to interface 30 reduces to 5°.

If the layers of semiconductor 8 have unequal refractive indexes, the value of $n_s$ is taken to be equal to the highest of these unequal refractive indexes. Substrate 5 may comprise a transparent support covered with a thin layer, next to core 8, having the refractive index $n_b$. In this case the transparent support may be of material, such as semiconductor, having a higher refractive index higher than $n_b$. For the thin layer to provide good reflection to guided light the thickness of the thin layer should be greater than the wavelength of the light generated, and preferably greater than twice the wavelength of the light generated.

Until it hits side wall 26, ray 29 is guided light travelling in the core of a light guide. The guided light 29 becomes converted into top light 29T. Light 29T is light that has passed through the p-layer 7 and top face 13. The top surface of metal support 3 can be relied on for reflecting light at the bottom of substrate 5 if there is no reflective coating 9 on substrate 5.

The arrangement of FIG. 2 can be regarded as consisting of nine elemental areas E1-E9 each emitting top light, each having at least one corner next to two trenches 14, and each covered with at least one top conductor 19. There is a trench 14 running between each adjacent pair of areas E. Top light 24 from top face 13 of each adjacent pair of elements E is accompanied with trench light emanating from the trench between the pair. The chip can be large, for example up to 1000 μm or more wide, and it may have more than nine elements E. Pads 11, 12 can each be about 150 μm square or less. The width of each element E is arranged to be several times greater than width K of trench 14. For example, the width of element E5 may be 300 μm and K may be 15 μm. Trench width K is preferably several times greater than the wavelength of the light from the active region, and is preferably more than twice the depth of trench 14. Conductor 16 between a pair of elements E provides a low resistance connection between the pair.

Figure 4:
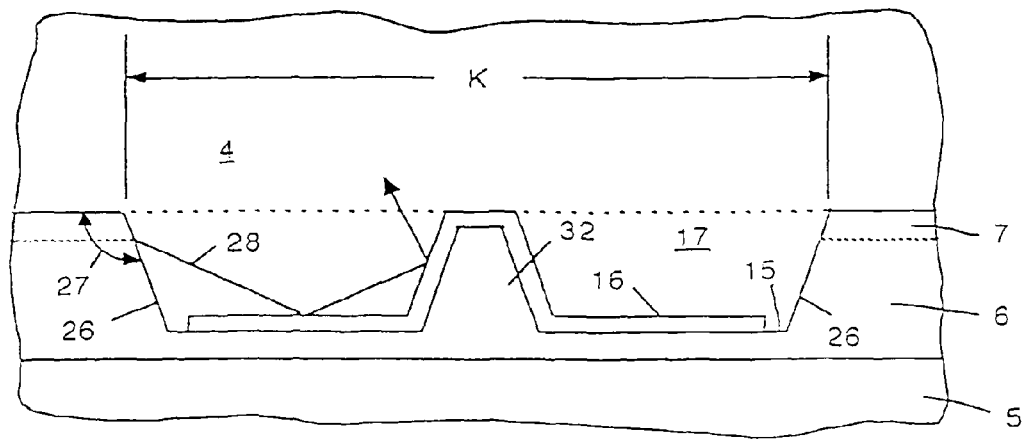
FIG. 4 is a cross-sectional view of a trench having a central ridge.

Transparent dielectric material 17 filling the trench may have a refractive index $n_t$ between 1.25 and 2.5. The value of $n_t$ affects transmission of light through wall 26. The higher the value of $n_t$ the larger the critical angle $\phi_{cst}$ at the inner face of trench wall 26 will be. With a larger critical angle more light can pass through trench wall 26. Trench 14 may have a central ridge 32, illustrated in FIG. 4, which extends along its length. Track 16 covers ridge 32. Ray 28 is shown doubly reflected by ridged track 16.

Figure 5:
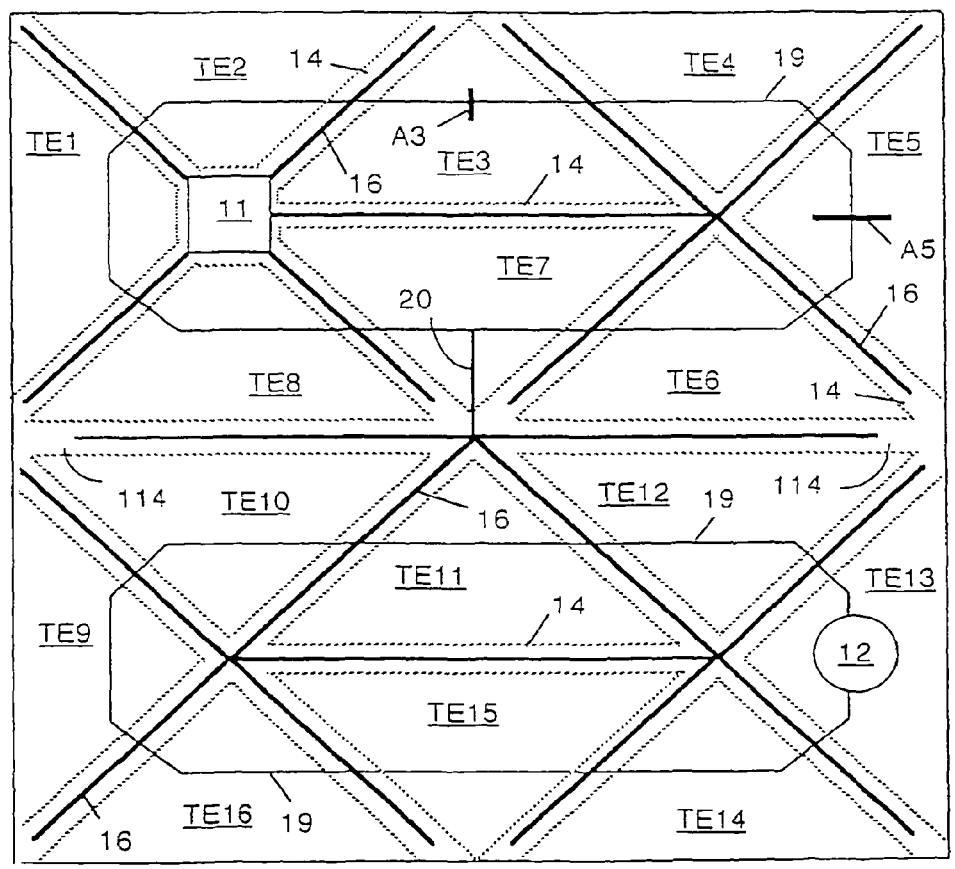
FIG. 5 illustrates a light source according to a further embodiment of the invention.

FIG. 5 illustrates a further embodiment of the invention. The arrangement differs from that of FIG. 2 in that it uses triangular light emitting elements instead of rectangular ones, and in that it includes two sets of light emitting elements connected in series. Chip 36 has 16 triangular light emitting elements, TE1-TE16. Elements TE1-TE8 are connected in parallel with each other. Also, elements TE9-TE16 are connected in parallel with each other. There is insulation, not shown, under conductors 19 at the areas where they cross over trenches 14, and there is insulation, not shown, under the whole of conductor 20. The n-layer for elements T1-T8 is isolated from the n-layer of elements TE9-TE16. The isolation can be achieved by making trenches 114, between set TE1-TE8 and set TE9-TE16, sufficiently deep so that their floors 15 are in substrate 5, instead of in n-layer 6. Trenches 114 may include conductors 16, as shown, or not.

Current applied to p-terminal 12 is fed to the p-layers of elements T9-T16 by means of conductors 19, and the current from conductors 16 of elements TE9-TE16 passes through conductor 20 to conductors 19 in contact with the p-layers of elements T1-T8. The current from conductors 16 of elements TE1-TE8 passes into n-terminal 11. Thus chip 36 comprises a first set of light generating elements (TE9-TE16 connected in parallel) connected in series with a second set of light generating elements (TE1-TE8 connected in parallel). Light extraction from the trenches can be as described before in relation to FIGS. 3, 4.

Figure 6A:
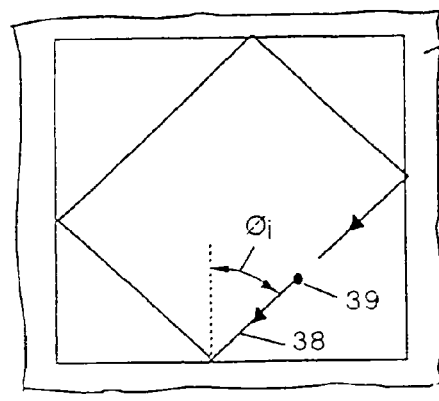
FIG. 6a illustrates light paths for an LED element having a rectangular top light-emitting surface.
Figure 6B:
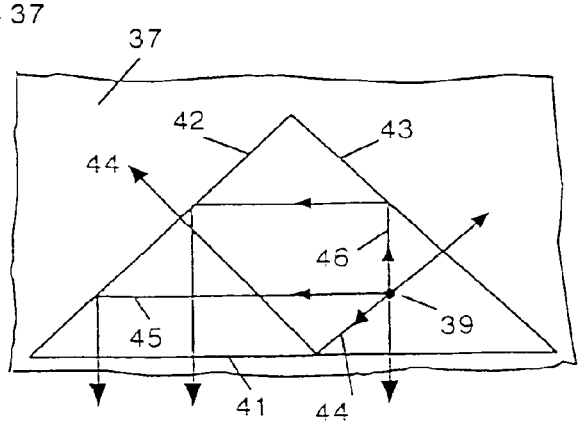
FIG. 6b illustrates light paths for an LED element having a triangular top light-emitting surface.

The use of triangular elements instead of rectangular ones enhances light extraction further. This is explained as follows. FIG. 6a illustrates in plan view an LED element embedded in epoxy 37 and having a conventional (rectangular) top light-emitting surface. Epoxy 37 is taken to have a refractive index that is half that of the semiconductor of the element, resulting in the critical angle being 30 degrees. A ray 38 that starts at a point 39 and that is parallel to top face of the element is shown hitting a side wall of the element at an incident angle $\phi_i=45°$. Ray 38 is subjected to successive total internal reflection and cannot escape from the element, as illustrated. By comparison with FIG. 6a, FIG. 6b shows in plan view an LED element embedded in epoxy 37 and having a triangular top, such as the ones in chip 36. The element has side walls 41, 42, 43. Side wall 41 is inclined to sidewall 42 by an acute angle of 45 degrees. Also, side wall 43 is inclined to sidewall 41 by an acute angle of 45 degrees. A ray 44 starting at point 39 can escape even if though it hits side wall 41 at 45 degrees, because after internal reflection it hits side wall 42 with an incident angle of zero. Rays 45, 46 also hit side walls at 45 degrees and subsequently escape. Thus the element with the triangular top is more efficient for light extraction from the semiconductor than the element with a rectangular top.

In the arrangement of FIG. 5, each of the elements TE may be provided with an individually chosen adjuster A. Only two of the adjusters, A3, A5, are shown. Each adjuster A is in contact with the p-layer under it. The areas of the adjusters are chosen so that each element TE has the same illumination as the other elements TE regardless of its position on the chip. Thus, for example, adjuster A5 is larger than adjuster A3. Thus the series resistance between track 19 and the p-layer is less for element TE5 than it is for TE3. By appropriate choice of the different adjuster sizes, all elements TE can produce the same light even if the voltages applied to them are not exactly the same, and even though some of the elements have only two associated trench conductors 16 instead of three. As an alternative to adjustment by elements A, the width of track 19 can be varied from element to element to achieve the matching. Matching by differing elements A or by variation of the widths of conductors 19 can also be provided for the elements E in the arrangement of FIG. 2. Uniformity of chip lighting of better than ±3% is desirable for lensed lamps used in video displays, so as to provide uniformity of the light projected by each lamp lens.

Manufacture of a light source unit based on the chip of FIG. 2 or FIG. 5, starting with a substrate wafer common to a plurality of final light source units, includes the steps, in order, of: applying a reflective layer, for reflector 9, to the bottom surface of the base wafer; forming the semiconductor layers over the top of the wafer; forming trenches 14 (and 114 in the case of FIG. 5) into the semiconductor by chemical etching or by other means; forming tracks 16 in the trenches; insulating trenches 14 at least at the parts thereof where tracks 19 will cross over, and providing insulation for conductor 20 in the case of FIG. 5; forming tracks 19; dicing the wafer to provide separate chips; and filling the trenches and covering the top and outer sides of each chip with transparent dielectric material having a refractive index of more than 1.25.

Figure 7A:
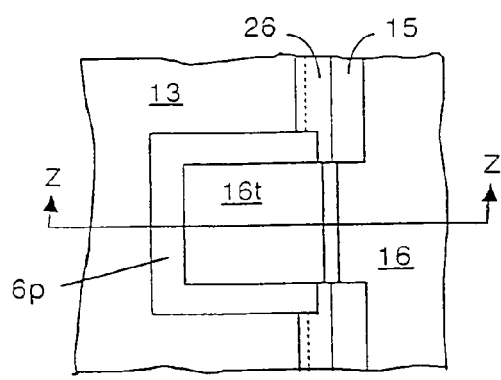
FIGS. 7a, 7b illustrate connection of a reflector track to a lower semiconductor layer.
Figure 7B:
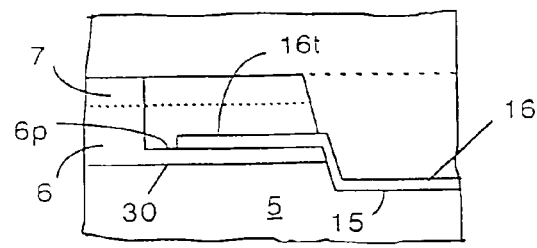

In the various arrangements discussed herein trenches 14 can extend into base 5 so that interface 30 is above the top of the portion of track 16 that is in contact with floor 15 of the trench. In this case, track 16 can have contact tabs 16t on both of its sides that are connected to the two n-layer zones separated by the trench. FIGS. 7a, 7b illustrate a contact tab which emanates from track 16 to make electrical contact with a small plateau 6p in n-layer 6. Each of the elements E or TE can have several contact tabs 16t electrically connected to the element.

In the various arrangements discussed herein reflector 16 can be extended in width so that it covers part or all of each of its side walls 26. In this case the trench is arranged to have translucent dielectric material over at least a portion of each side wall 26 to prevent short circuiting the p-layer to the n-layer. Furthermore, in the various arrangements discussed herein trench 14 may have a side-wall profile that includes one or more steps.

Figure 8:
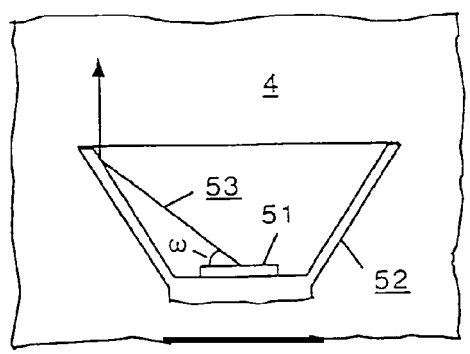
FIG. 8 illustrates a reflector cup for the chips of FIGS. 2, 5

FIG. 8 illustrates another embodiment of the invention. Chip 51, of the type of FIG. 2 or FIG. 5, mounted in a metallic reflective cup 52 and embedded in epoxy 4. The top of epoxy 4 (not shown) is formed as a lens. Cup 52 is made deep so that a ray 53 emanating from the central area of the top face of chip 51 at an angle w relative to the chip top face is deflected by the cup. Angle w is greater than 30 degrees, and preferably greater than 40 or 45 degrees.

Figure 9:
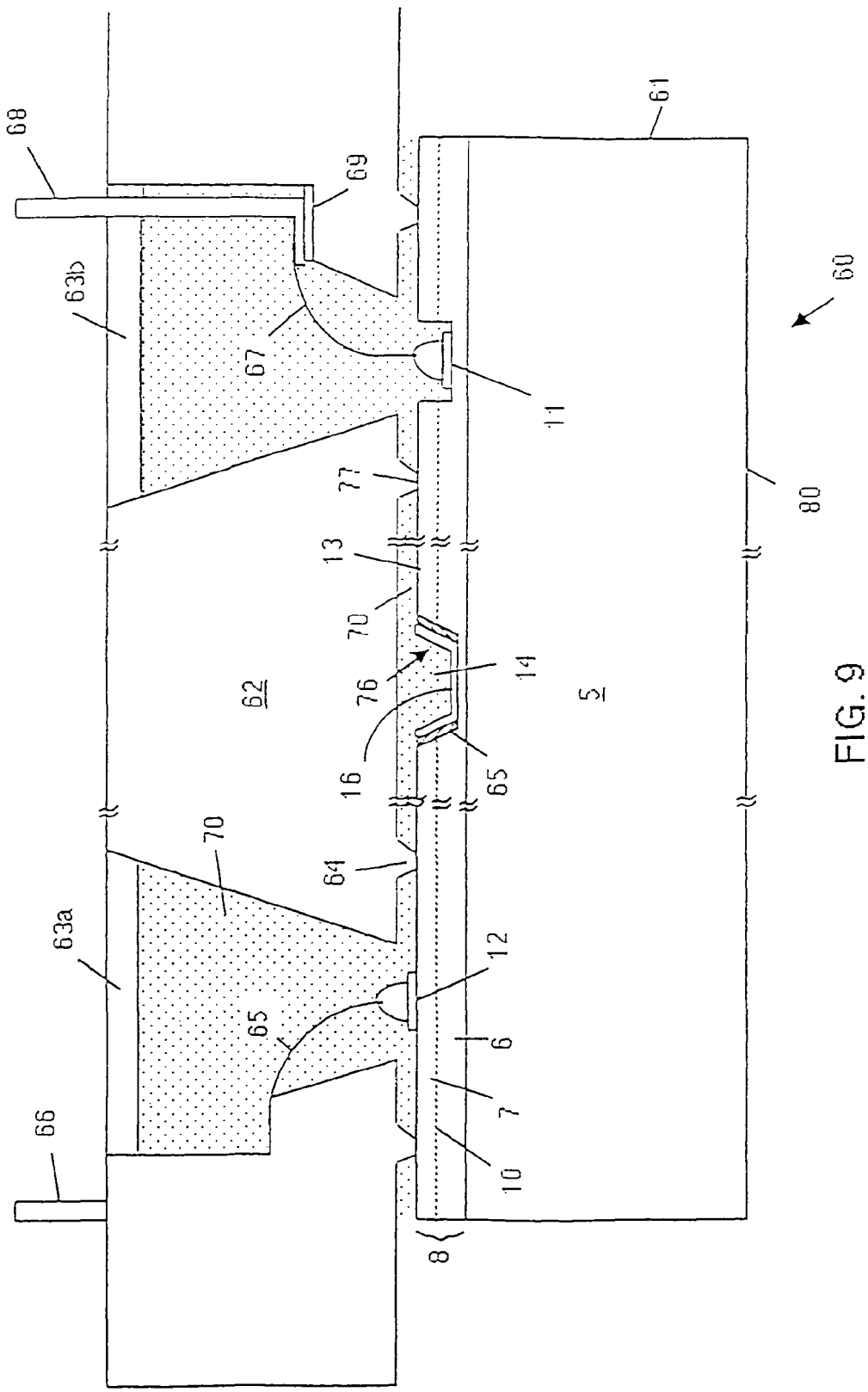
FIG. 9 illustrates an embodiment of the invention having a heat sink on the chip top face.

FIG. 9 illustrates schematically a further embodiment of the invention. Light source 60 comprises a chip 61 which is preferably of the same or similar construction as that previously discussed for FIG. 2 or FIG. 5, but with no reflector 9 on substrate 5. Chip 61 may be as large as 5 mm wide and have many elements and have an input power of 5-25 watts. For the arrangement of FIG. 9, track 16 is preferably either of small width (preferably less than 0.5 K}, or of large width, about equal to K, as shown in FIG. 9. A transparent insulator 65 covers each of the two semiconductor side walls. Track 16 covers each of insulators 65. Thus the whole of the side wall 76 includes a metallic reflector insulated from p-layer 7 and active region 10. The two side walls 76 each form an obtuse angle with top face 13. A heat sink 62 of aluminum, which has a high thermal conductivity and high optical reflectivity, is placed over chip 61. Heat sink 62 has integral spacer portions 64 drawing heat away from chip top face 13. Heat sink 62 can be 5 mm thick, or more, and is thermally connected to a larger heat sink, not shown, that cools heat sink 62. Chip p-terminal 12 is connected by bonding wire 65 to aluminum heat sink 62 and hence to the p-terminal 66 of the lamp. Chip n-terminal 11 is connected by bonding wire 67 to lamp n-terminal 68 which is supported on insulator 69. Openings 63a, 63b in heat sink 62 allow access to the chip terminals to achieve bonded wiring 65, 67. After bonding of wires 65, 67 epoxy is injected into openings 63a, 63b to protect wires 65, 67 and to cover top face 13 with epoxy. Covering top face 13 with epoxy provides perfect reflection for guided light and enhances extraction of top light from chip 61. After leaving the chip the top light is reflected by the under surface of heat sink 62 to pass back into the chip and out of substrate 5. Faces 77 of spacers 64 can be small, so that most of top face 13 is covered with epoxy, and hence most of the reflections of guided light by interface 13 are 100% total internal reflections. For the internal reflections occurring at faces 77, a proportion of the light energy is lost at each reflection. Spacers 64 can be numerous, so that they provide adequate cooling of the semiconductor junction 10. Thermal connection between spacers 64 and chip top face 13 can be enhanced by coating the lower faces of spacers 64 with a suitable heat transfer compound before pressing heat sink 62 onto chip 61. Epoxy 70 may be laid on top face 13, for example by pad printing, prior to pressing heat sink 62 onto the chip and as a separate operation from filling cavities 63a, 63b. Any translucent material having a refractive index greater than 1.25 may be used instead of epoxy for medium 70. The thickness of medium 70 under heat sink 62 is preferably greater than the wavelength of the light of the chip. The thickness can be several times the wavelength. The lower surface of heat sink 62 may be covered with an electrically insulating coating.

A 25 watt chip can have 256 light emitting elements E or TE. It is not essential to have perfect yield of the light emitting elements. If production quality is such that a few of the elements do not emit light, the lamp will still function to give powerful light.

Referring to FIG. 2, each of elements E2, E4, E5, E6. E7, E9 has an individual p-conductor 19 energising the element. It is possible by modification of the wiring to arrange that all the elements E have individual p-conductors. In this case each individual p-conductor may have a fuse, such as fuse 71 illustrated for element E6, arranged to burn out when the current to the element exceeds the intended current for the element by a factor of, for example, 2.5. By this means, short-circuited elements in the chip are automatically isolated when the power is applied to the chip. The triangulated chip of FIG. 5 also may have its wiring re-arranged to provide individual fusing of each of the elements TE. Fuse links 71 of elements E, TE that draw excessive current may be burnt out, i.e., disrupted, at production time to render them open circuit by applying a test current to the chip. Alternatively, fuse links 71 of elements E, TE that draw excessive current may be may be disrupted by a laser beam directed at them. Determination of which of the fuse links 71 are to be disrupted with the laser beam can be carried out with the aid of a heat-sensing camera directed at the chip while the chip is energized. In this case elements E or TE that are, for example, 20 degrees hotter than the average temperature of all the elements are identified as the ones drawing more than their allowable current and are selected for disruption of their links 71 using the laser.

A lamp of 256 elements can be wired as 16 blocks in series, each block having 16 elements TE connected in parallel, with each element TE having its own fuse. With this arrangement failure of an element TE, during manufacture or during service, does not put another element TE out of action. If, for example, in each bock four random elements TE are open circuit, the lamp will still function. With the yield of good elements TE at only 75% the lamp gives about 75% of the light of a lamp having no faulty elements TE.

Figure 10:
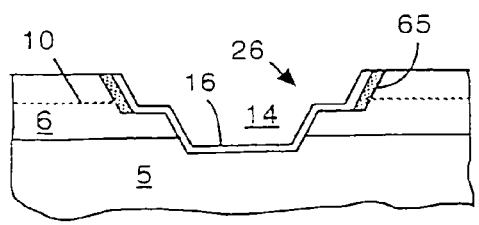
FIG. 10 illustrates an alternative form of trench.

FIG. 10 shows another arrangement for trench 14 that can be used in any of the chips described herein. As shown, trench 14 cuts into substrate 5, and includes translucent dielectric 65 over the p-layer portion of stepped side wall 26. Track 16 makes electrical contact with n-layer 6 at side wall 26.

In the various arrangements that have been discussed herein, layers 6, 7 and the active region 10 may each comprise nitride of two or more of gallium, indium and aluminium, or nitride of just one of these elements, and the substrate can be sapphire.

Figure 11:
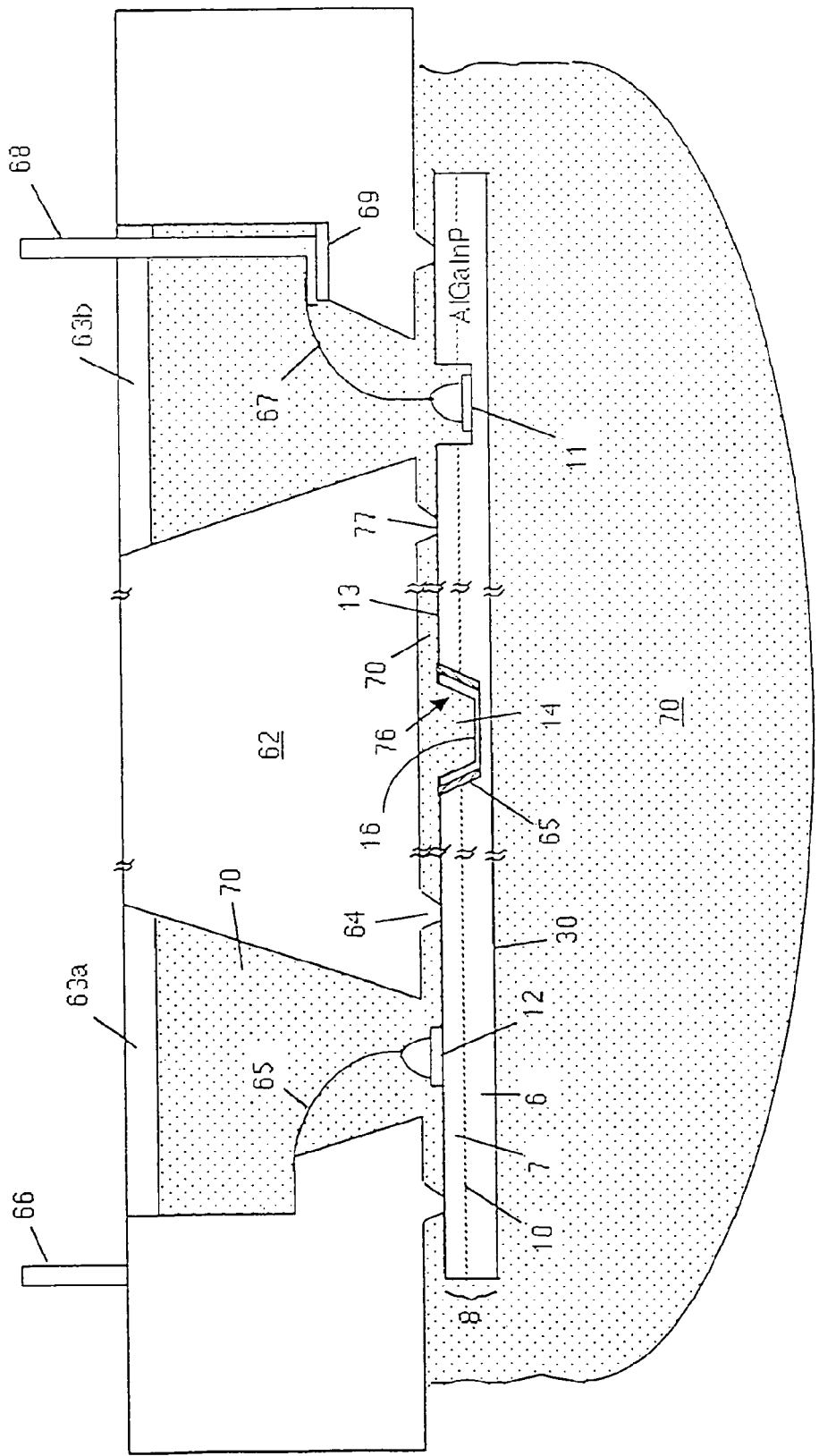
FIG. 11 illustrates an embodiment of the invention using an AlGaInP light source.

FIG. 11 illustrates schematically another embodiment of the invention. Semiconductor core 8 comprises LED layers with the active region 10 generating amber or red light, such as may be required for an amber or red single-chip traffic light. The construction of FIG. 11 is provided by starting with the construction of FIG. 9 using in the construction of FIG. 9 an LED chip 61 having a core 8 comprising AlGaInP LED layers lattice matched and joined to a substrate 5 of GaAs. Core 8 may include a window layer of p-type GaP above the AlGaInP LED layers. Although for simplicity of illustration only one light extraction trench 14 is shown, there are in fact several light extraction trenches, the arrangement of core 8 being preferably the same as or similar to the arrangements of FIG. 2 or FIG. 5. Member 62 is the substrate for core 8 during and after removal of the GaAs. Removal of the GaAs substrate completes the manufacture of semiconductor core 8. Member 62 can be of the same width as core 8 or wider. The lower surface of heat sink 62 is made electrically non-conductive to avoid unwanted electrical contact between the heat sink and the top surface of core 8.

After the attachment of the AlGaInP LED chip 61 to heat sink 62 as shown in FIG. 9, the GaAs substrate 5 of chip 61 is selectively etched off, leaving the lower surface of the AlGaInP. LED core 8 exposed. GaAs is absorbent to visible light. Selective etching of the GaAs substrate 5 may be achieved using, for example, a mixture of hydrogen peroxide and ammonium hydroxide. Core 8 may include as its lowest layer a semiconductor stop-etch layer that enhances the resistance of core 8 to the etchant. As a protection against unwanted etching sideways of core 8, the four outer side surfaces of LED core 8 can be covered with material that is insoluble by the etchant. Heat sink 62, also, may optionally be coated for protection against the etchant. Heat sink 62 provides structural support for core 8 during removal of the GaAs and after this removal. After chip substrate 5 has been removed, the lower surface of LED core 8 is covered with epoxy 70, which can be formed as a lens. For enhanced protection of core 8 against strain and against ingress of moisture, a sheet of glass having a refractive index of 1.5-1.8 may be bonded to the lower surface 30 of core 8, covering all of that surface.

The AlGaInP LED lamp of the invention is not limited to having a light extraction cavities 14 of the form shown in FIGS. 9, 11. The light extraction cavities may take any of the other forms previously described in relation to the chip patterns of FIG. 2, 5.

Figure 12:
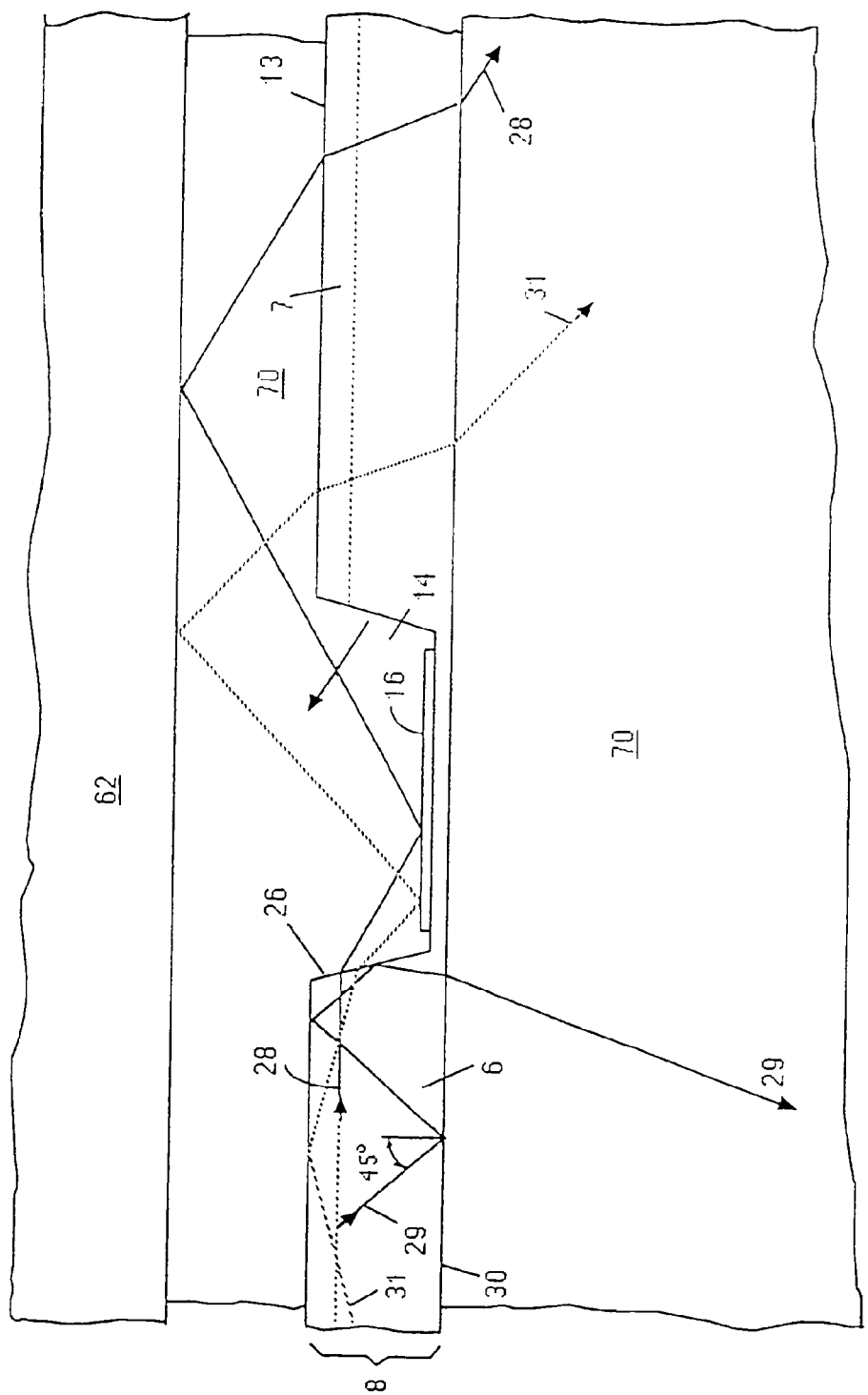
FIG. 12 illustrates light extraction from an AlGaInP light source.

FIG. 12 illustrates one alternative cavity arrangement 14 that can be used instead of the cavity arrangement 14 shown in FIG. 11. The cavity of FIG. 12 is similar to that shown in FIG. 3. It is seen from FIG. 12 that light reflected upwards in cavity 14 by reflector 16 is reflected downwards by the reflective surface of heat sink 62 to pass through core 8. Thus the light reflected upward by reflector 16 can escape from the lamp.

AlGaInP core 8 has a refractive index of about 3.3 and epoxy 70 in FIG. 12 may have a refractive index of about 1.5. In this case core 8 will be a light guide to all light generated by active region 10 that has an angle of incidence to surface 13 or surface 30 exceeding about:

$$\sin^{-1}(1.5/3.3)=27°$$

Thus most of the light generated by active region 10 of the AlGaInP LED will be trapped in core 8 until it reaches one of the light extraction cavities 14. On reaching the various light extraction cavities 14 an important proportion of the trapped light will escape from core 8. FIG. 12 illustrates the entrapment and escape of ray 29 having an initial angle of incidence to core face 30 of 45°.

Figure 13:
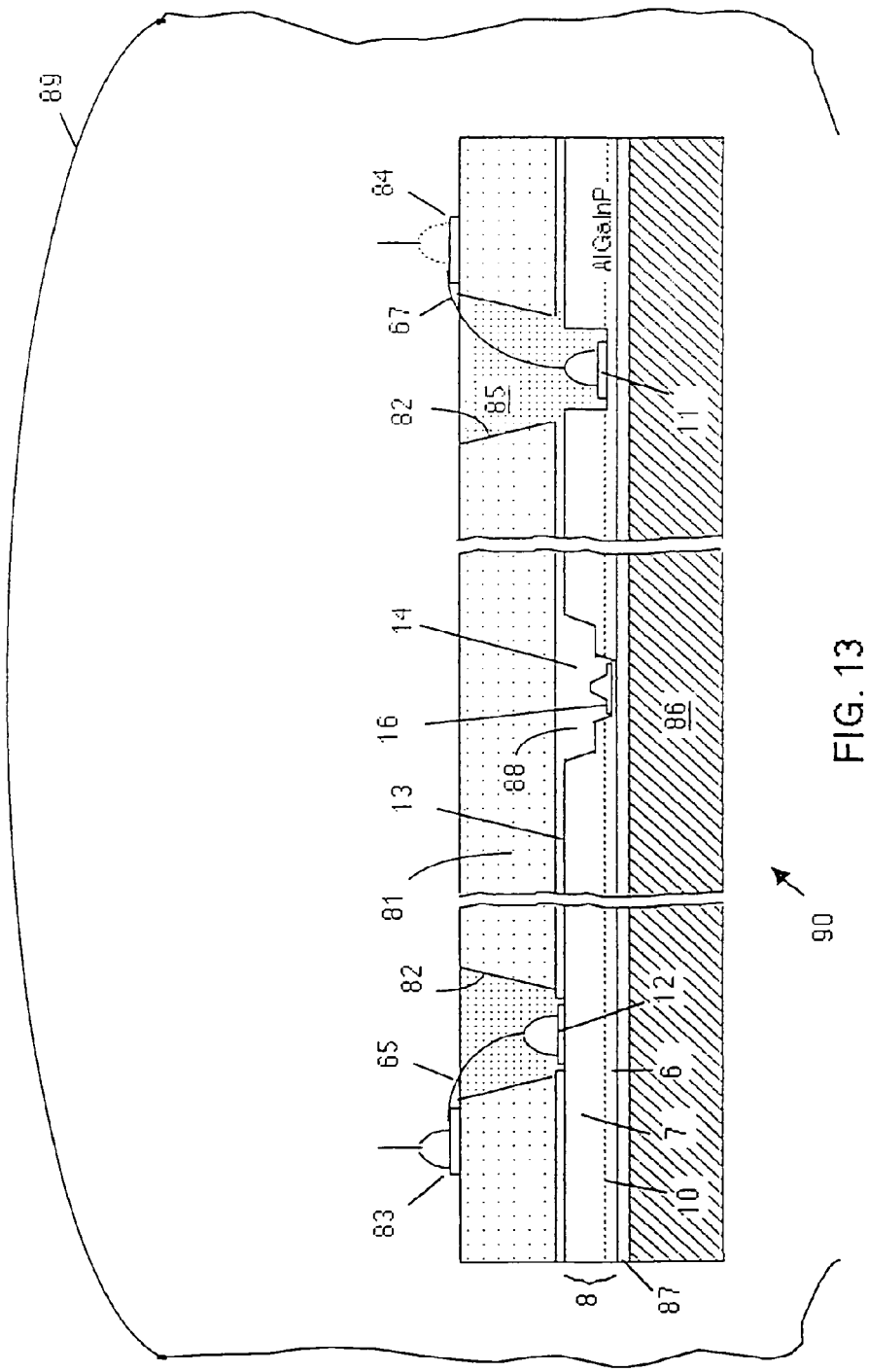
FIG. 13 illustrates another embodiment of the invention using AlGaInP.

FIG. 13 illustrates schematically a further embodiment of the invention. Light source 90 includes a heat sink 86 which may be of metal. The top of heat sink 66 is made reflective. Above heat sink 86 is a reflecting layer 87. Layer 87 is of translucent amorphous material, such as epoxy; i.e., layer 87 is not a crystal. Above layer 87 is a semiconductor light-guide core 8 comprising layers of AlGaInP. Formed into core 8 is a set of light-extraction cavities 14 and conductors 16, 19, for example having a plan view shown in FIG. 2 or FIG. 5. Above core 8 is a glass sheet 81 having a through-hole 82 opposite each of chip terminals 11, 12. Glass sheet 81 may have a thickness of between 0.2 and 1 millimeters and a refractive index of between 1.5 and 1.8. Glass sheet 81 has attached thereon a pair of metallic contact pads 83, 84 which are electrically joined to chip terminals 12, 11 respectively by bonding wires. Glass sheet 81 is covered with a lens 89 formed from translucent epoxy. Layer 97 of epoxy bonds glass sheet 81 to core 8.

The device of FIG. 13 has no semiconductor substrate. Amorphous sheet 81 serves as a substrate during manufacture of the device; and reflective amorphous sheet 86 serves as a final substrate for mounting the device onto a heat sink.

Figure 14:
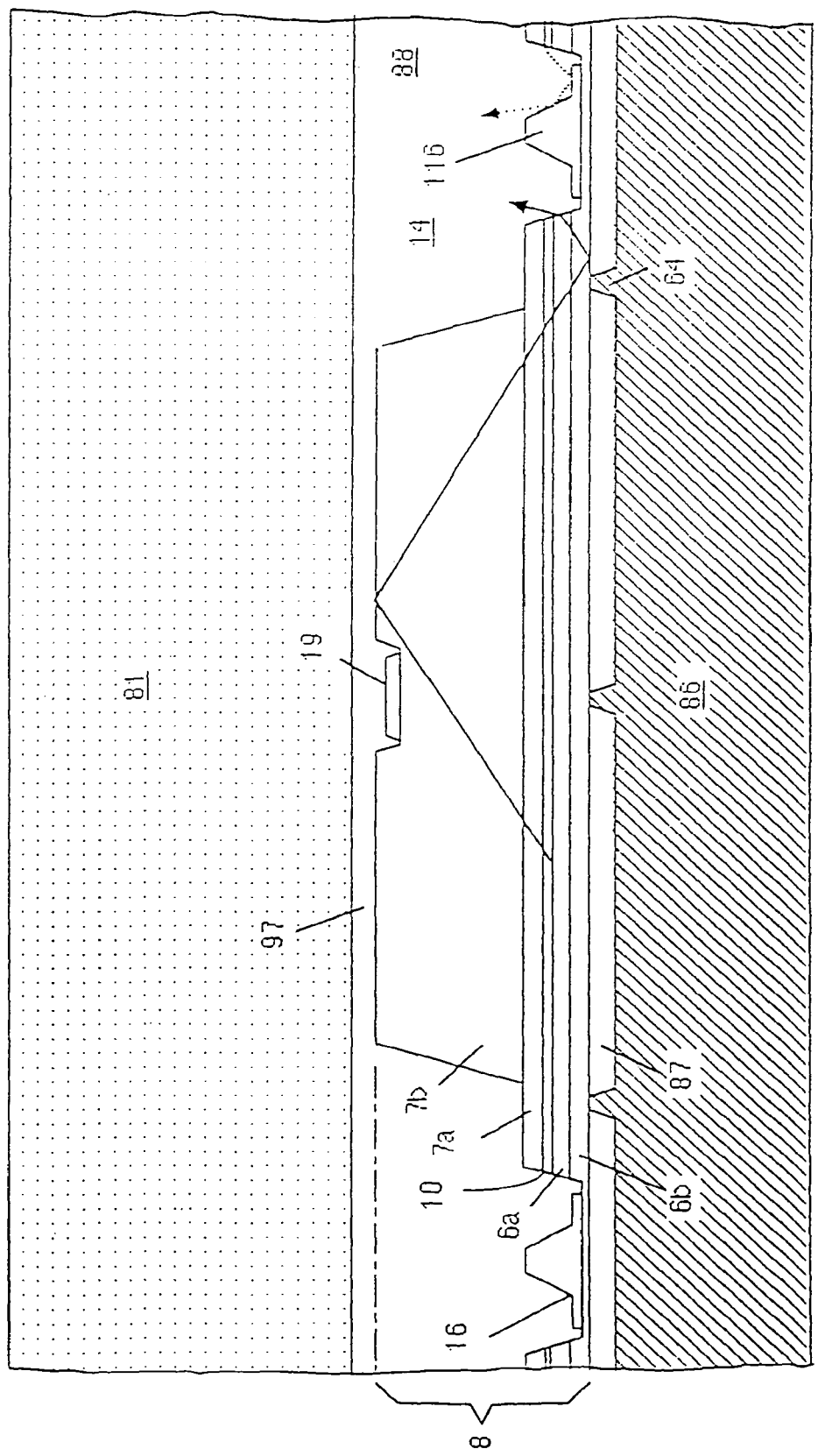
FIG. 14 illustrates layers of the arrangement of FIG. 13.

FIG. 14 illustrates an element E or TE and a preferred arrangement for the semiconductor layers of core 8 of FIG. 13. Referring to FIG. 14, layer 7 comprises an AlGaInP p-layer 7a next to active layer 10. Active layer 10 is preferably of AlGaInP. A GaP layer 7b of higher electrical conductivity than layer 7a is placed over layer 7a. Metal n-track 16 has a raised portion 116 that reduces the longitudinal resistance of the track. Layer 6 consists of an AlGaInP layer 6a next to active layer 10 and an AlGaInP layer 6b under layer 6a. Layer 6b is of higher electrical conductivity than layer 6a and acts as a translucent contact layer for energising layer 6a. Metal n-track 16 has a raised portion 116 that reduces the longitudinal resistance of the track. Cavities 14 are filled with translucent material 88 having a refractive index of less than 2.5, for example epoxy. Holes 82 are filled with material 85 through which moisture will not pass.

Heat sink 86 may be provided at its top with optional spacers 64. Heat sink 86 may be joined at its lower face to another, larger heat sink, not shown. Glass sheet 81 should have a thermal coefficient of expansion less than $20 \times 10^{-6} K^{-1}$. For minimal strain of semiconductor core 8, glass sheet 81 should have about the same thermal coefficient of expansion as semiconductor core 8.

Both of layers 87, 97 may be of epoxy, in which case each of the layers 87, 97 will be reflective to all rays having an incident angle $\phi_i$ that is greater than about $\sin^{-1} 1.5/3.3 = 27°$ (3.3 being an approximate value for the refractive index of GaP, as well as AlGaInP). Thus each of layers 87, 97 will be reflective to rays incident to it from core 8 at 45°.

Figure 15A:
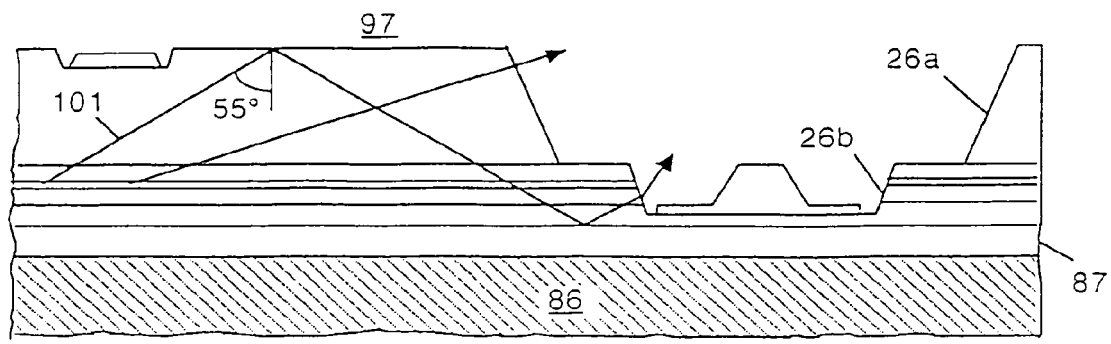
FIG. 15 illustrate light rays in the layers of FIG. 14.
Figure 15B:
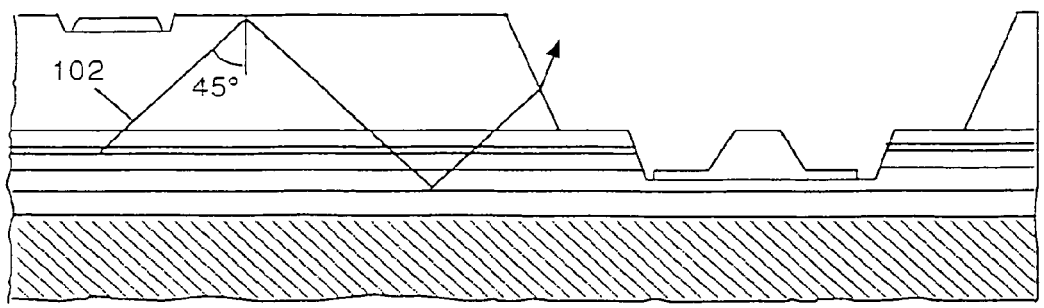
Figure 15C:
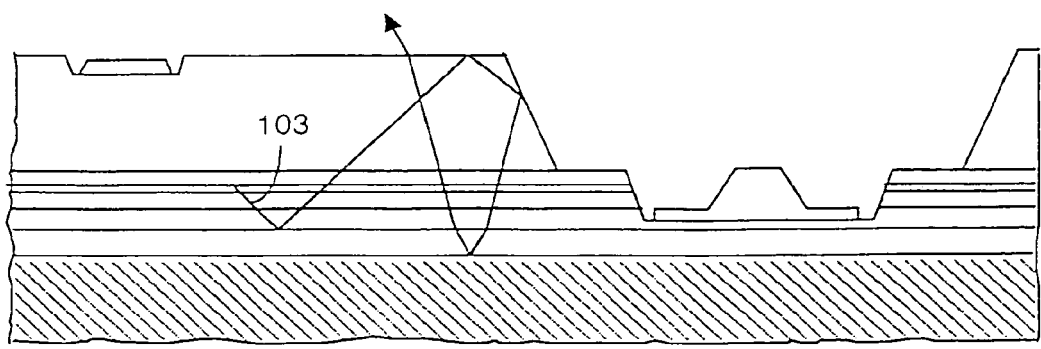

FIGS. 15a, 15b, 15c illustrate escape of light guided in core 8. It is seen that each of rays 101, 102, 103 is reflected by both lower reflector 87 and upper reflector 97 before escaping from core 8. Rays 102, 103 are incident to reflectors 87, 97 at 45°. Ray 101 is incident to reflectors 87, 97 at about 55°.

The width of trench 14 is greater at the open top of the trench than it is in the bottom of the trench, allowing light passing through side walls 26a, 26b to escape easily from the trench. As an alternative to using a translucent medium for layer 87, layer 87 may be a metallic reflector, in which case spacers 64 are not used. As another alternative, layer 87 may be eliminated, and the reflective top of heat sink 86 relied upon to act as a reflector. Since glass has about the same refractive index as epoxy, layer 97 may be eliminated.

Figure 16A:
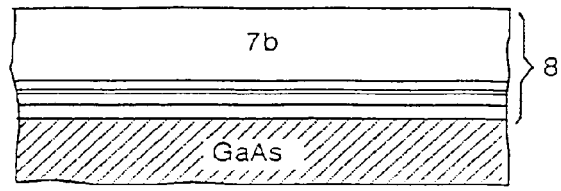
FIG. 16 illustrate manufacturing steps for producing the arrangement of FIG. 13

Manufacture of the AlGaInP lamp of FIG. 13 can be achieved using, for example, the following steps. Starting with a GaAs wafer, the AlGaInP layers 6b, 6a, 10, 7a, and a GaP layer 7b are grown over the GaAs substrate, providing the core 8, as represented by FIG. 16a. Because the AlGaInP layers are grown on GaAs they have the same lattice constant as GaAs. From the wafer of FIG. 16a a plurality of devices are formed, each device having, for example, all the features shown in FIG. 2, or all the features shown in FIG. 5, i.e. including trenches 14 and conductors 16, 19, 11, 12 and optional fuses 71.

Figure 16E:
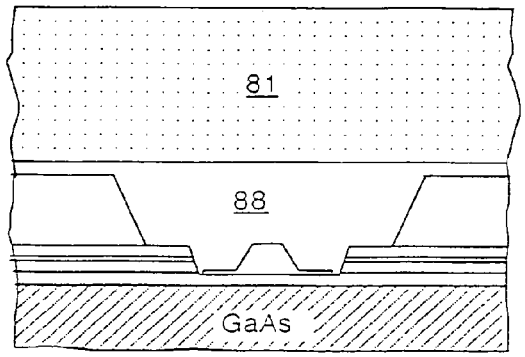
Figure 16B:
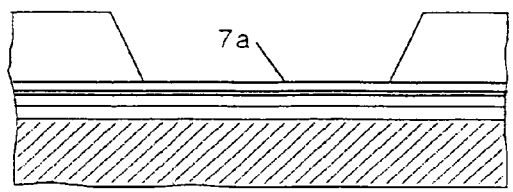
Figure 16F:
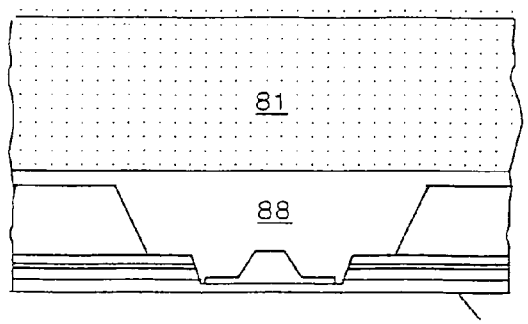
Figure 16C:
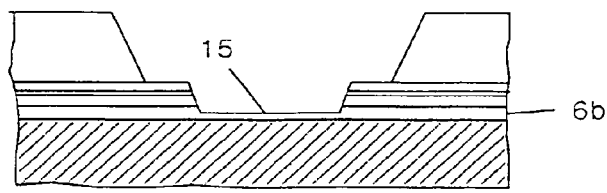

Stepped trenches 14 can be formed in the wafer of FIG. 16a by etching in two stages as illustrated by FIGS. 16b, 16c. The first etching stage is carried out using a process or etchant that is selective to removing GaP. Such an etchant will expose the top of layer 7a. The next etching stage is carried out using a process or etchant that removes the AlGaInP layers down to floor 15 in layer 6b. An advantage of etching in two stages is that it can give more precise depth of etching into the AlGaInP layers, since the etching of the AlGaInP layers starts exactly at the top of layer 7b, which is closer to trench floor 15 than is the top of layer 7b. The combined thickness of layers 6b, 6a, 10 and 7a can be less than three microns and the thickness of layer 7b can exceed fifteen microns.

Figure 16D:
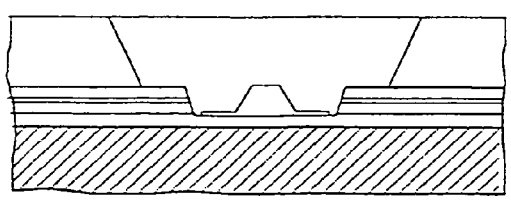

Next, the n-tracks 16 are formed, as represented by FIG. 16d. At the same time as forming tracks 16, connection pads 11, 12 are formed. Next, the p-tracks 19 are formed (not shown in FIG. 16). Next, cavities 14 are filled with epoxy, or with other translucent material of refractive index less than 2.5. Next a perforated glass sheet 81 large enough to cover all the devices on the wafer is bonded onto the top of layer 7 of the wafer, with the sets of perforations 82 positioned to coincide with the sets of bonding pads 11, 12 as shown in FIG. 13. The bonding of the glass sheet to the top of the wafer can be done using epoxy or by other means. Sets of terminal pads 83, 84 are provided on the glass sheet, for example prior to bonding the glass sheet to the wafer. FIG. 16e illustrates glass layer 81 attached to the wafer.

Next, for each of the devices formed on the wafer, terminal 12 is joined to terminal pad 83 and terminal 11 is joined to terminal pad 84, using thermocompression bonding as illustrated in FIG. 13, or by other means. Next, holes 82 are filled with moisture-stopping filler 85. Next, the GaAs layer is removed, as represented by FIG. 16f.

Figure 16G:
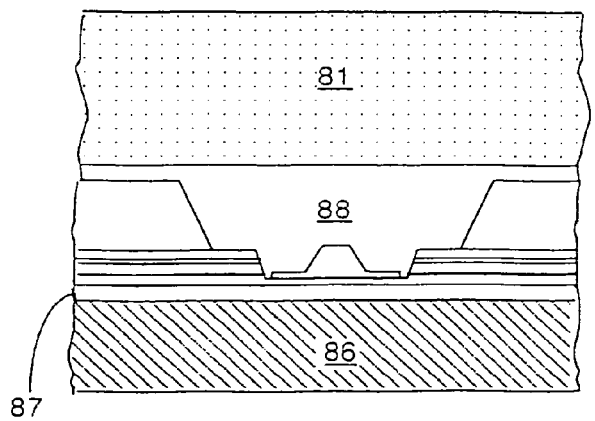

Next, a heat sink sheet 86 having a reflective top face is bonded to the wafer, using epoxy for example, as represented by layer 87 in FIG. 16g. As a final stage of wafer processing, the wafer is divided into separate devices, each having a pair of terminals 83, 84 by which the device can be energized.

Glass sheet 81 provides a substrate that supports core 8 during removal of the GaAs. If desired, the step of joining a heat sink layer 86 to the wafer can be eliminated; in this case the wafer is divided into the separate devices and then each device is joined to a heat sink individually.

Semiconductor layer 6b may be of GaP instead of AlGaInP, or it may comprise a layer of AlGaInP over a layer of GaP. Furthermore, conductor tracks that are in ohmic contact with the lower surface of layer 6b may be provided to supplement or replace the electrical function of tracks 16. GaP can be grown on the underside of layer 6b in FIG. 16f provided transparent body 81 and filler 88 are selected to withstand the temperature needed for growing the GaP.

Another manufacturing procedure for achieving high light output is illustrated in FIG. 17. On a gallium arsenide substrate 105 is grown an n-type AlGaInP layer 107a, an AlGaInP active layer 110, a p-type AlGaInP layer 106a and a p-type GaP layer 106b, as represented by FIG. 17a. Next, as shown in FIG. 17b, a metal heat sink layer 111 having a reflective top face is bonded to layer 106b using a translucent bonding layer 112 of material that can withstand and remain solid at the high temperatures used in subsequent wafer processing, for example 300-500° C. for contact alloying and 500-700° C. for growth of GaP layer 106b. Layer 112 may be a printed layer of glass powder, or other material of high melting temperature, that is melted to achieve the bonding. Next, GaAs layer is removed as represented by FIG. 17c. Next, an n-type GaP layer 107b is grown over layer 107a, as represented by FIG. 17d.

Figure 17A:
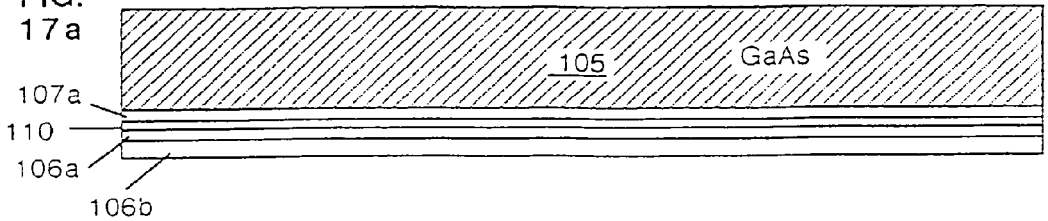
FIG. 17 illustrate a method of producing an AlGaInP LED according to the invention.
Figure 17B:
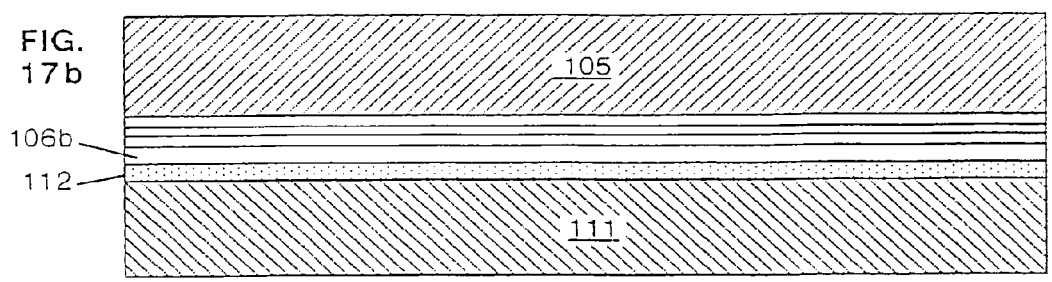
Figure 17C:
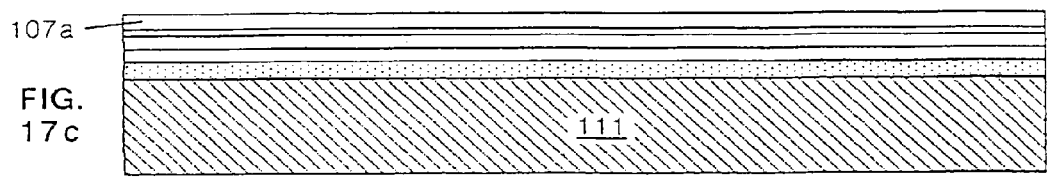
Figure 17D:
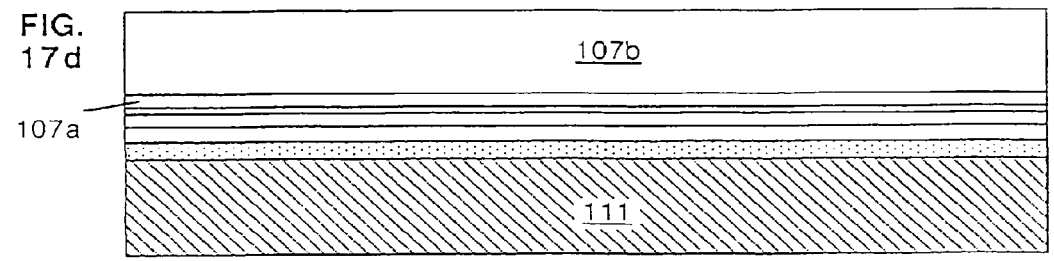
Figure 17E:
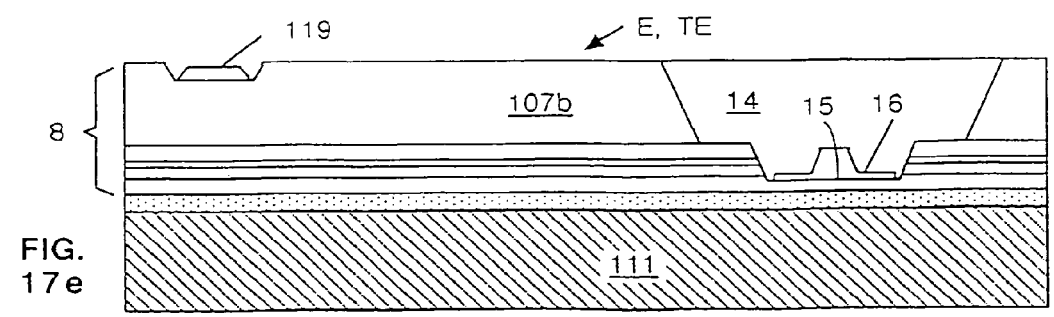

Next, trenches 14 are formed. Next trench conductors 16 in contact with p-layer 106b are formed. A p-terminal, not shown in FIG. 17e, is also formed in contact with p-layer 106b. Next, top conductors 119 are formed in contact with n-layer 107b and an n-terminal, not shown, also is formed in contact with n-layer 107b. The conductors and terminals of core 8 can be formed by known methods involving deposition and etching of doped metal; followed by heat treatment at a temperature above 300° C. (typically 400-500° C.) to cause the metal dopants to migrate into the semiconductor and thus provide good ohmic contact. Translucent bonding layer 112 must withstand the heat treatment temperature and should not be molten at that temperature. The wafer is finally divided into separate lamp-chips each of which may be five millimeters wide. For each lamp-chip, heat sink 111 is joined to a larger heat sink. Since layer 111 serves as a substrate for the chips it is made substantially thicker than core 8, for example 100-1000 microns thick.

Figure 18:
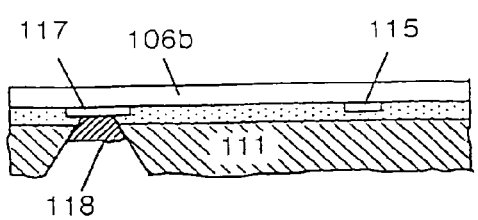
FIG. 18 illustrates a method of making electrical contact to a semiconductor layer.

FIG. 18 illustrates a further embodiment of the invention, using electrical connections made to the lower surface of core 8 of an AlGaInP lamp. Optional track 115 ohmically connected to layer 106b can supplement or replace the electrical function of trench track 16. Conductor pad 117 ohmically connected to layer 106b can serve as one of the terminals of the chip, and it can be electrically connected to heat sink 111 by solder 118 as shown, or by other means. Ohmic contacts 115, 117 to layer 106b can be provided, for example, just after formation of the structure of FIG. 17a.

Substrates 86, and 111 of FIG. 17, can be of translucent material, such as glass. In this case metal reflector track 16 can be extended in width so as to cover the trench side walls, provided track 16 is electrically insulated from the side walls. Substrate 111 and bonding layer 112 can be one translucent item deposited on layer 106b, for example a glass-like sheet that is placed onto layer 106b and then heated to fuse it on.

FIG. 19e illustrates an alternative arrangement for joining the semiconductor core 8 to metal heat sink 111. In this case the joining operation is carried out using metal layers 122, 123, instead of using the translucent bonding material 112 shown in FIG. 17b. FIGS. 19a-19d illustrate manufacturing steps for the arrangement of FIG. 19e. Layers 107a, 110, 106a, 106b are grown on the GaAs substrate 105, as shown in FIG. 19a. Then a translucent layer 120 is grown on layer 106b. Translucent layer 120 may be of $SiO_2$ having a refractive index of about 1.6. One or more through-holes are provided in layer 120 and metallic electrical contacts 121 are made to layer 106b through the holes. A reflective metal layer 122 is then formed over translucent surface 120 and contacts 121. Layer 122 is thus electrically connected to layer 106b, via contacts 121. Heat sink 111 is coated with a metal layer 123 as shown in FIG. 19b. Coated heat sink 111 is pressed onto layer 122 and the temperature of the resultant assembly is raised so that one or both of layers 122, 123 melts, joining the two layers together. Then the GaAs layer 105 is removed, leaving the structure illustrated by FIG. 19c. Then GaP layer 107b is grown over the structure of FIG. 19c, to provide the structure of FIG. 19d. Then trenches 14, reflectors 16 and p-tracks 119 are formed.

GaP layer 107b can be grown by metalorganic chemical vapour deposition (MOCVD) at a temperature above 500° C., typically 600-700° C. Each of metal layers 122, 123 should be solid at the GaP growth temperature. Layer 122 can be of aluminum or silver, or of an alloy. If heat-sink 111 is required to be electrically insulated from layer 106, formation of contact 121 and its associated hole can be dispensed with. As a further option, reflective layer 122 can be placed directly on the lower surface of core 8, dispensing with layer 120, provided layer 122 remains reflective and layer 106b remains translucent after, growth of layer 107b.

A translucent sheet, such as perforated glass sheet 81 of FIG. 13 may be bonded to the top of the core 8 of the arrangement of FIG. 17e or FIG. 19e. Optionally, layer 107b may be dispensed with in the arrangements of FIGS. 17e, 19e, in which case manufacturing stages 17d, 19d, respectively are dispensed with.

The various features that have been already described in relation to the chips of FIGS. 2, 5, such as for example the provision elements E or TE with fuses or series connections, can be incorporated in the AlGaInP lamp arrangements of FIGS. 11, 12, 13, 17e, 19e. Each of these arrangements is capable of high power dissipation in the light generating region (10, 110) of core 8, since there is no semiconductor substrate between the AlGaInP layers and the heat sink 62, 86, 111. The typical thickness of an ordinary chip substrate is 100-300 microns. By comparison, the distance from core 8 to the heat sink (62, 86, 111) can be as little as a micron. To ensure good heat removal from the AlGaInP layers it is desirable that the distance between the core and the heat sink 62 be less than 50 microns, and preferably less than 25 microns and, more preferably still, less than 5 microns. With the improved heat sinking provided by the arrangements of FIGS. 11, 13, 17e, 19e the core temperature during operation will be reduced. Consequently the lamp will have a higher efficiency, since light output of an AlGaInP lamp drops as the junction temperature rises. Also, the rate of degradation of the LED will be reduced and the lamp will last longer.

For each of the arrangements of FIGS. 11, 13, 17e, 19e the total thickness of semiconductor core 8 is preferably less than 50 microns, and it can be 5-10 microns. The depth of trench 14 measured from the top face of semiconductor core 8 to the floor 15 of the trench is preferably greater than 50% of the thickness of core 8, and more preferably greater than 70% of the thickness of core 8. Each of the translucent layers immediately above and immediately below core 8 (for example 87, 97 in FIG. 13) should be reflective to rays incident to the layer for all angles of incidence greater than 60°, and preferably for all angles of incidence greater than 55°, and more preferably for all angles of incidence greater than 45°. To achieve reflection of rays in core 8 incident to a translucent member 70, 87, 97, 81, 112, 120 at 55° to the member, the member must have a refractive index that is at least 18% lower than the refractive index of core 8. To achieve reflection of rays in core 8 incident to the translucent member at 45° the member must have a refractive index that is at least 29% lower than the refractive index of core 8.

Each of the light reflecting layers 70, 86, 87, 97, 111, 112, 120, 122 that have been discussed is a non-semiconductor and amorphous. A semiconductor would not be suitable for any of these layers. It would typically not reflect light incident to it at 60°, 55° or 45°; because it would not have a sufficiently low refractive index relative to that of core 8 to cause the reflection.

Heat sink 62 or 86 or 111 may be of copper-tungsten (CuW), which has a coefficient of thermal expansion (6× $10^{-6}$/K) that is close to that of semiconductor core 8. The surface of the heat sink adjacent to core 8 can in this case be coated with aluminum or silver or some other reflective material.

The elements E or TE in the AlGaInP embodiments of FIGS. 11, 12, 13, 17e, 19e can be made small, for example 50 microns wide or less, so that each element takes very little current. Reducing the current of an element E or TE reduces lateral voltage drops in the p-type and n-type AlGaInP layers of the element and enhances uniformity of illumination of the element. Each of the elements E or TE can have more than one conductor (19 or 119) feeding the p-layer (7b or 107b).

For each of the arrangements of FIGS. 11, 12, 13, 17e, 19e the LED active region (10, 110) is preferably less than 50 microns away from the heat sink, and more preferably less than 25 microns away. The depths of light extraction cavities 14 in core 8 can be as great as the thickness of core 8. Connection of tracks 16 to p-layer 6 or 6b or 106b can be by side contact-tabs, such as 16t previously described with reference to FIGS. 7a, b.

Referring to the chip construction shown in FIG. 13, layer 81 may be of metal instead of glass, in which case layer 86 is made of transparent material for light output downwards. Terminals 83, 84 are insulated from sheet 81 or eliminated.

For each of the arrangements of FIGS. 11, 12, 13, 17e, 19e semiconductor core 8 may be of AlGaAs grown on GaAs, instead of AlGaInP grown on GaAs. AlGaAs has very nearly the same lattice constant as GaAs, and about the same refractive index as AlGaInP. As another alternative, core 8 may comprise one or more layers of AlGaInP and one or more layers of AlGaAs, the layers having been grown on a GaAs substrate. The use of AlGaAs layers is less preferable than the use of AlGaInP, because AlGaAs layers give less light output. Window layers 6b, 7b, 106b, 107b can be of other semiconductor material than GaP that is translucent to the LED light.

Figure 20A:
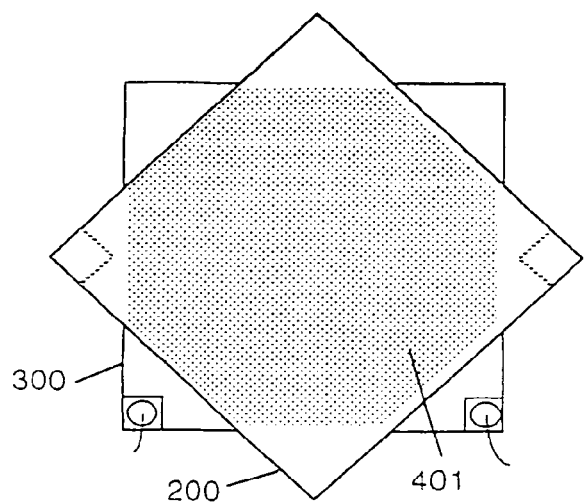
FIG. 20a illustrates in plan view an embodiment for generating white light
Figure 20B:
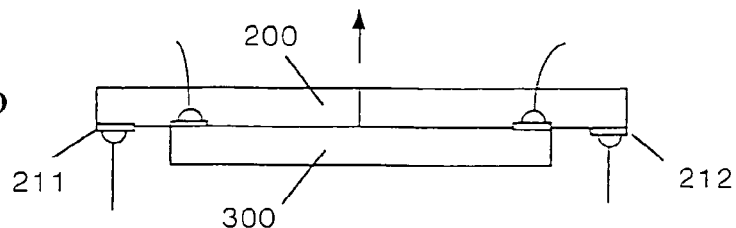

FIGS. 20a, 20b illustrate an embodiment of the invention for providing white light. A chip 200 generating blue-green light of about 487 nanometer dominant wavelength is placed over a chip 300 generating amber light of about 592 nanometer dominant wavelength. The eight triangular chip portions extending beyond the octagonal overlap area of the two chips are arranged by electrical means, or by optical masking, so that they do not produce light. Octagonal dotted area 401 represents the light generated by the two chips. A heat sink, not shown, is provided under chip 300.

Figure 21:
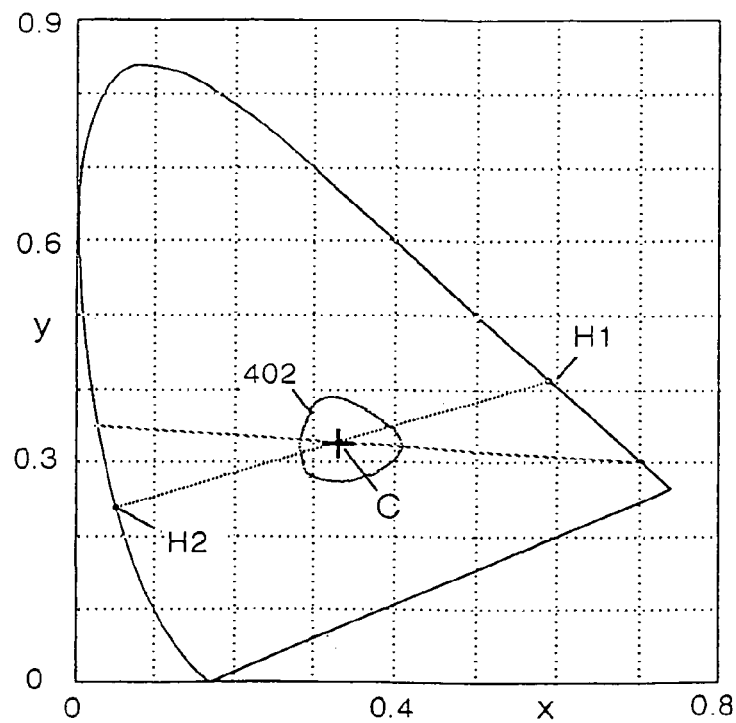

FIG. 21 shows the CIE 1931 (x, y) chromaticity diagram. Point "C" represents a standard white having chromaticity coordinates x=y=0.33. All points within boundary 402 also represent white light. By combining the amber 592 nm light (represented by point H1) with the 487 nm blue-green light (represented by point H2) in roughly equal proportions white light is produced.

Figure 22:
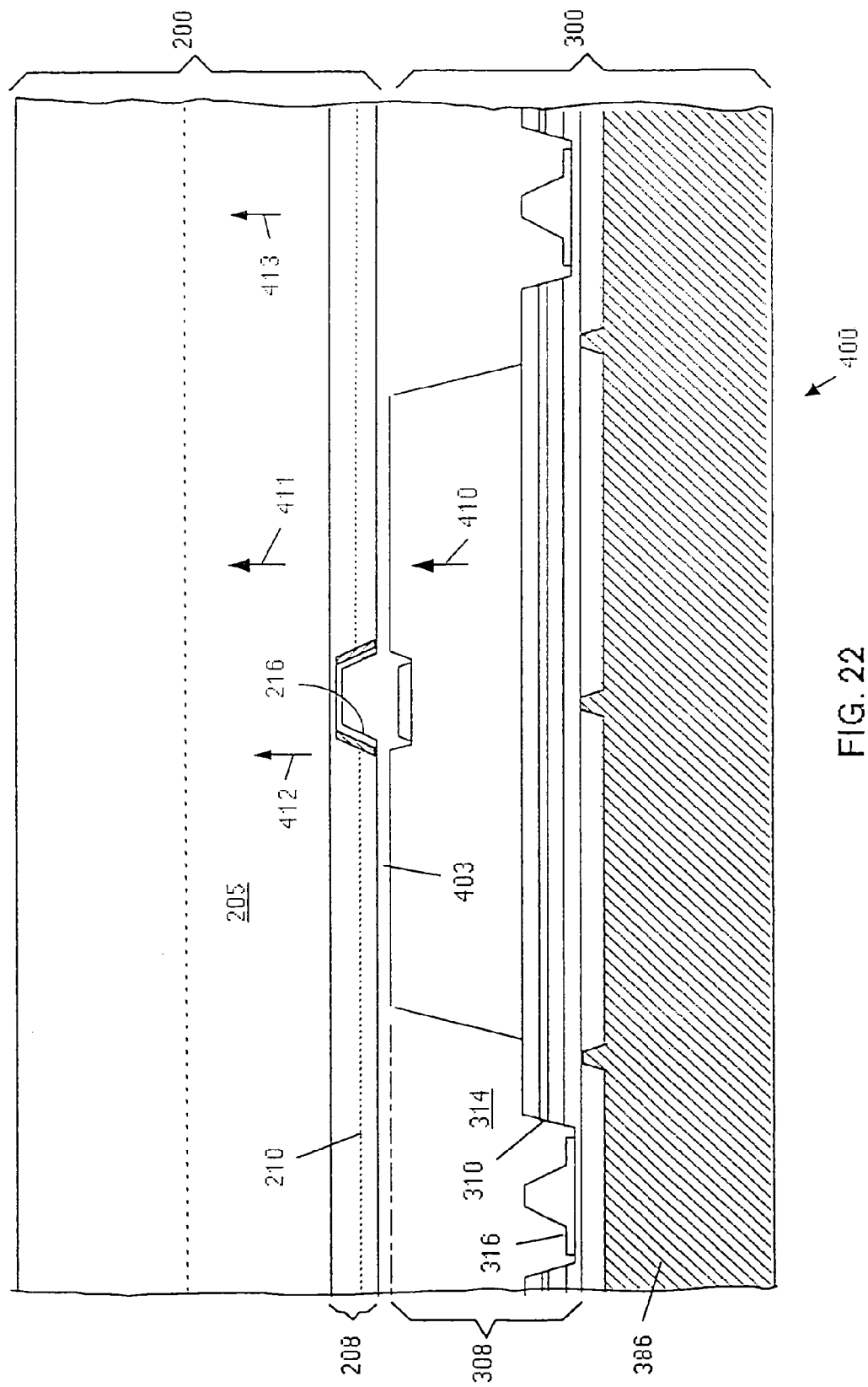

FIG. 22 illustrates layers in the octagonal region 401 of the arrangement of FIG. 20. Chip 200 comprises a light guide core 208 grown over a sapphire substrate 205. Core 208 comprises p-type and n-type layers of gallium nitride, or nitride of gallium and other elements such as indium and/or aluminum; and active region 210 which can be composed of $In_xGa_{1-x}N$. Active region 210 is arranged for generating the 487 nm blue-green light. Chip 200 has several light generating elements E or TE and reflective tracks 216. Chip 200 is basically the same in construction as chip 61 of FIG. 9. Chip 300 has a core 308 over a heat sink layer 386. The assembly comprising core 308 and heat sink 386 is the same as was described for FIG. 14. Active layer 310 of $(Al_xGa_{1-x})_{0.5}In_{0.5}P$ is arranged to generate the 592 nm amber light. Chips 200, 300 are separated by a thin layer 403 of translucent material, such as epoxy, having a refractive index lower than those of the semiconductors. Layer 403 allows light of 60° incidence to layer 403 to be guided sideways in each of cores 208, 308. As an example, if reflector layer 403 has a refractive index of 1.5 and core 208 has a refractive index of 2.5, then reflector 403 will be reflective to rays incident to it from core 208 at an angle of incidence of $\sin^{-1}(1.5/2.5)=37°$. Thus all 208 rays having an angle of incidence to reflector 403 greater than 37° will in this case be reflected. If the mesa 7b of core 308 has a refractive index of 3.3 then a reflector 403 with a refractive index of 1.5 would be reflective to rays from the mesa incident to the reflector at an angle of incidence of $\sin^{-1}(1.5/3.3)=27°$. Thus in this case all rays from the mesa of core 308 having an angle of incidence to reflector 403 greater than 27° will be reflected back into the mesa. Without reflector 403 most of the light generated by active region 210 would be absorbed by semiconductor core 308. Cavities 314 can be filled with the same material as layer 403 or with other material, such as a translucent paste of high thermal conductivity and of refractive index greater than 1.2 and lower than 2.

Amber top light 410 from the LED semiconductor stack 308 is combined with blue-green light from LED semiconductor stack 208 to provide output white light 411. Interleaved with the white light 411 are thin bands of relatively intense blue-green light 412 from reflectors 216 and bands of whitish amber light 413 corresponding to intense amber light emanating from trenches 314. If both chips have many elements E or TE the general effect will be that all the light becomes blended and appears white. This is true even if the light is collected and projected by a convergent lens, providing the lens is defocussed so that it projects a blurred image if the light source.

Active regions 208, 308 are both cooled by heat sink 386. The thickness of core 308 is preferably less than 40 microns; and more preferably less than 15 microns. The thickness can be as little as 5 microns. The distance between active region 210 and heat sink 386 is preferably 5-50 microns, and more preferably 5-25 microns. It is possible to use for LED structure 200 an LED chip such as that described with reference to FIG. 3 or FIG. 4. In this case the top of the chip is bonded to a transparent, such as glass, which now becomes a new substrate, and the original substrate 5 is ground down to a small thickness, for example 20 microns. The thinned original substrate 5, which is placed over reflector 403, can be mirrored at those portions of its lower surface that are below side walls 26, so as not to lose rays 29 (shown in FIG. 3) into core 308, The non-mirrored portion of the lower surface of thinned substrate 5 serves as a window for passing most of the light from core 300.

Part of the top of core 308 may be soldered to part of the under-surface of structure 200 to enhance cooling of core 208. In this case each of the two mentioned parts is pre-coated with a metal reflector, and the solder join is between the two metal reflectors. To avoid electrical shorting of core 200 to core 308, the metal reflector on core 308 can be underlaid with a very thin insulating layer, such as $SiO_2$.

Structure 200 may act as a support for core 308 during removal of the growth substrate of core 308.

Chip 300 can be arranged to generate light of any color in the range from red to yellow. Whichever color is chosen, the corresponding color wavelength of chip 200 is chosen to be on a line passing through the point on the CIE diagram representing the color of chip 300 and the white area 402.

To reduce the chance of chip breakage during bonding to chip pads 211, 212 (FIG. 20b), sapphire substrate 205 is preferably made thicker than 100 microns. Alternatively, it may be 100 microns thick and reinforced with a sheet of glass bonded to its top. The heat sink under layer 386 (not shown} is perforated or otherwise shaped to allow access to terminals 211, 212 for thermocompression or other electrical bonding. Chips 200, 300 can be shifted slightly one relative to the other instead of being skewed in order to have access to the chip terminals, in which case overlap pattern 401 will be rectangular.

A further embodiment of the invention will now be described with reference to FIG. 23. Light source 420 has LED chips 200, 300 vertically stacked as shown in FIG. 22. Over the top of chip 200 is a layer 421 of translucent fluorescent material. In manufacture of chip 300, crystal growth of $(Al_xGa_{1-x})_{0.5}In_{0.5}P$ active region 310 is started with x=0.05 (approximately) for generating red light of about 640 nm wavelength; and as the active region builds up in thickness, the value of "x" is gradually increased to about 0.35, corresponding to generation of yellow or amber light. At that point growth of the active region 310 is stopped. The result of gradually changing the value of "x" is that all colors in the range from red to yellow or amber are generated by active region 310, as represented by curve 431 in the spectral distribution diagram of FIG. 24. Curve 431 has a broad flat top from about 590 nm to about 640 nm.

Figure 23:
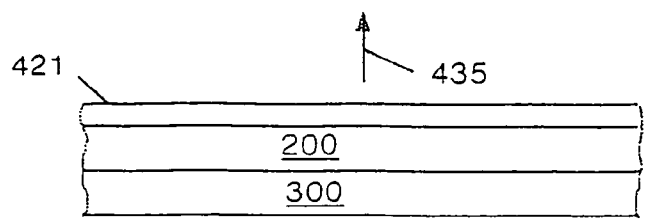
FIG. 23 illustrates another embodiment for producing white light

In manufacture of chip 200 for the arrangement of FIG. 23, crystal growth of the $In_xGa_{1-x}N$ active region 210 is started with a value for "x" suitable for generating blue light of about 470 nm wavelength and the value of "x" is held constant for part of the growth period of active region 210. Then the growth of active region 210 is continued now gradually increasing the value of "x" to a value that generates green light of about 530 nm wavelength, at which point growth of active region 210 is terminated. The purpose of this procedure is to provide a spectral distribution for active region 210 represented by curve 432 in FIG. 24. Curve 432 has a blue peak portion 433 corresponding to the growth with "x" held constant. The flat portion of curve 432 corresponds to the growth during which "x" is gradually increased.

Figure 24:
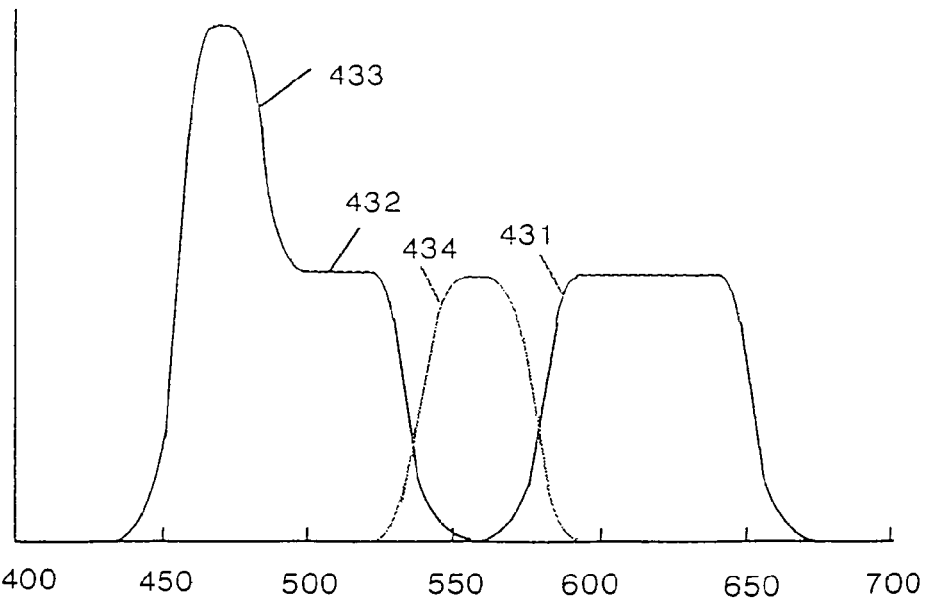
FIG. 24 illustrates components of light produced by the embodiment of FIG. 23
Figure 25:
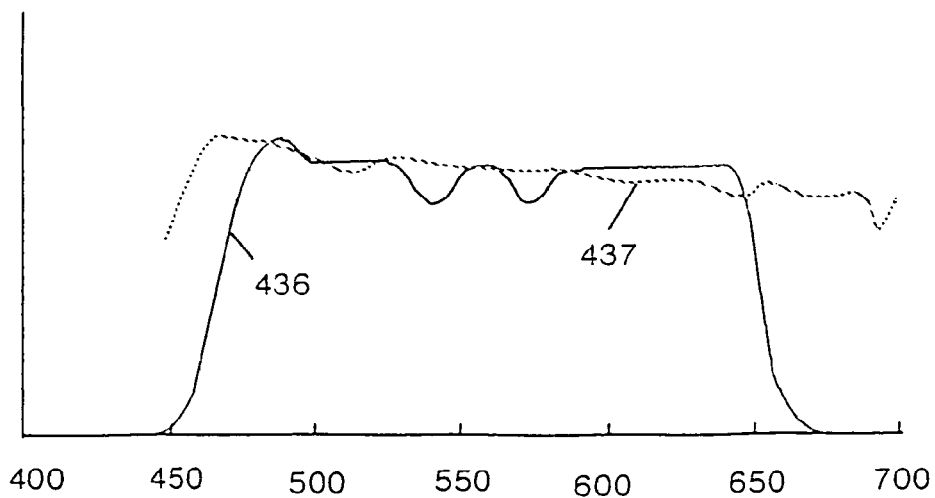
FIG. 25 illustrates the spectral distribution of the white light produced by the embodiment of FIG. 23.

Translucent fluorescent top layer 421 is arranged to absorb a part of the energy at and under peak 433 and to convert the absorbed energy into green light represented by dotted curve 434 in FIG. 24. The spectral distribution of the light 435 emanating from the top of layer is illustrated by curve 436 in FIG. 25. Curve 436 represents a spectral distribution in the blue (470 nm) to red (640 nm) range that is more or less flat, and similar to the spectral distribution 437 of average daylight. Thus there is provided a high power (e.g. 1-50 watts) light source giving light similar to daylight and with most of the light energy provided by just two LED chips. Only a small proportion of the light in the spectral distribution 436 is provided by the fluorescent means 421.

Fluorescent layer 421 can be arranged for converting UV light, instead of blue light, to light 434 in FIG. 24. In this case structure 200 is arranged to generate UV light as well as visible light, the visible light having a more or less flat spectral distribution from about 450 nm to about 530 nm.

Figure 26:
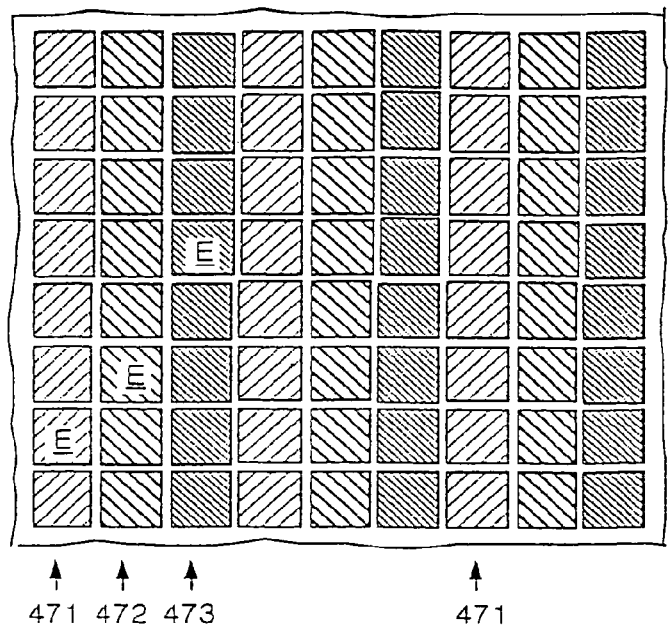
FIG. 26 illustrates an LED chip according to a further embodiment of the invention, having elements of three colors.

For each of the structures 200, 300 the spectral distribution of the structure can be broadened by having two or three differing colors for the elements E, or TE, instead of the spectral distribution being broadened by varying "x" during growth of the active region. If the elements E of structure 300 are arranged as a matrix, illustrated in FIG. 26, with columns 471, 472, 473 generating red (R), orange (O) and yellow (Y) light, respectively, then the mixed or integrated light for structure 300 will have the spectral distribution illustrated by curve 481 in FIG. 27. Similarly, If the elements E of structure 200 are arranged as a matrix with columns 471, 472, 473 generating green (G), blue-green (BG) and blue (B) light, respectively, then the average or integrated light for structure 200 will have the spectral distribution illustrated by curve 491 in FIG. 27. The combined curves 481, 491 provide a spectrum distribution that roughly approximates that of daylight in the 470-640 nm band.

For each of the structures 200, 300 the spectral distribution of the structure can be broadened by having two or three differing colors for the elements E, or TE, instead of the spectral distribution being broadened by varying "x" during growth of the active region. If the elements E of structure 300 are arranged as a matrix, illustrated in FIG. 26, with columns 471, 472, 473 generating red (R), orange (O) and yellow (Y) light, respectively, then the mixed or integrated light for structure 300 will have the spectral distribution illustrated by curve 481 in FIG. 27. Similarly, If the elements E of structure 200 are arranged as a matrix with columns 471, 472, 473 generating green (G), blue-green (BG) and blue (B) light, respectively, then the average or integrated light for structure 200 will have the spectral distribution illustrated by curve 491 in FIG. 27. The combined curves 481, 491 provide a spectrum distribution that roughly approximates that of daylight in the 470-630 nm range. The differing colors of the elements E of the structures 200, 300 can be provided by using apertured masks for growing the active regions of the elements. Thus, for example, for growing the red-generating active regions for columns 471 of chip 300 the mask has openings at column positions 471, but not at column positions 472, 473.

Figure 27:
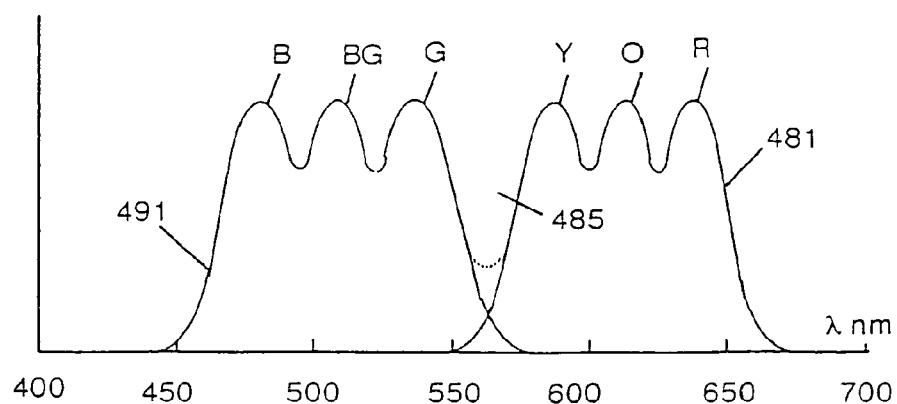
FIG. 27 illustrates the spectral distribution of white light produced by employing the chip of FIG. 26.

Dip 485 in FIG. 27 can filled using fluorescent material, over parts of the blue columns or as layer 421, that converts blue light to light of about 560 nm. To compensate for the loss of blue light caused by the fluorescent material the widths of the blue columns can be increased.

Figure 28:
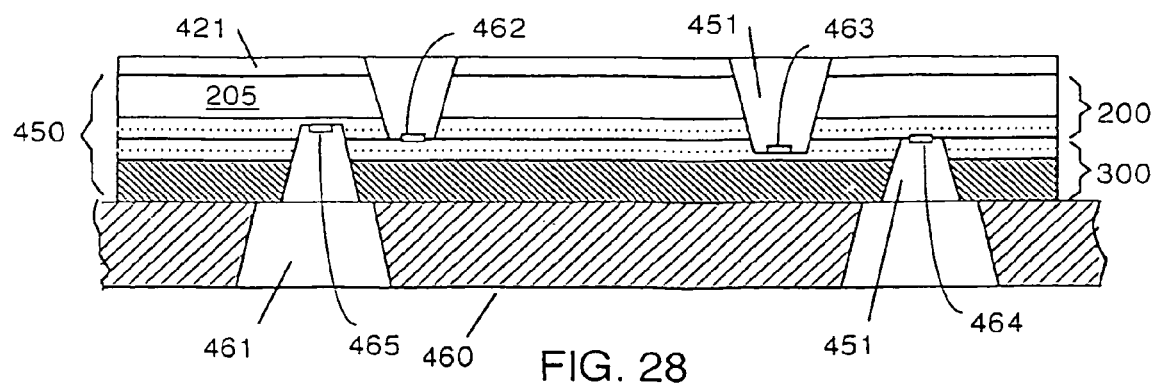
FIG. 28 illustrates an arrangement for making connections to a two-chip white light source.

In another embodiment, adapted to provide an alternative arrangement for making connections to structures 200, 300, the structures are perforated and joined together at the wafer stage, and then the wafer pair is sawn into separate white-light units (composite chips) 450. A unit 450 is shown in FIG. 28, joined to a major heat sink 460. Perforations 451 in layers 200, 300 and perforation 461 in heat sink 460 allow access to the four terminals. As shown, 462, 463 are p, n terminals, respectively, for light generator 300; and 464, 465 are p, n terminals, respectively, for light generator 200. This arrangement avoids the triangular overhangs of FIG. 20.

Figure 32:
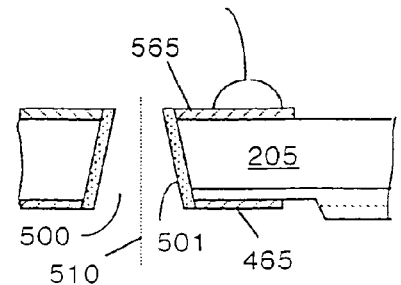
FIG. 32 illustrates an arrangement for making electrical connection to a GaN LED from the sapphire side.

FIG. 32 illustrates an arrangement according to the invention by which an electrical connection to the n-layer of structure 200 can be made from the top instead of from the bottom. In this case a hole 500 is provided in sapphire substrate 205 which is through-plated with metal 501 to connect n-terminal 465 to an upper n-terminal 565. Line 510 may be a line along which the wafer is divided into chips, in which case a single hole 500 can serve the n-terminals of four chips. P-terminals on top of structure 200 can similarly be provided.

The arrangement of FIG. 20 or FIG. 28 (or FIG. 28 adapted to have top terminals to source 200 as was described in relation to FIG. 32) can be adapted to provide a high power lamp of variable color. In this case layer 200 is arranged to have alternating blue, 492, and green, 493, columns of elements E shown schematically in FIG. 29. The columns form finely interleaved luminous stripes when energized. The blue elements E have a p-terminal 494 for driving them, and similarly all the green elements E have a p-terminal 495. Terminal 496 is common to the blue and green elements, Layer 300 is arranged to produce red light. Thus there is provided an RGB lamp in which each of the three colors can be adjusted individually in intensity. The RGB lamp can produce white light when all three colors are turned on simultaneously. The white light in this case has the spectral distribution 438 shown in FIG. 30. A convergent lens may be used to project the light. The projected light will have a substantially spatially smooth mix of the three colors, providing the lens is defocussed relative to the interleaved stripes 492, 493. The defocussing blurs the blue and green stripe colors into each other.

Figure 29:
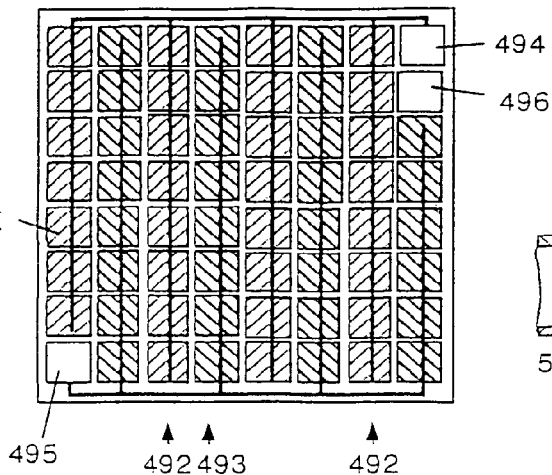
FIG. 29 illustrates a chip according to another embodiment of the invention.
Figure 30:
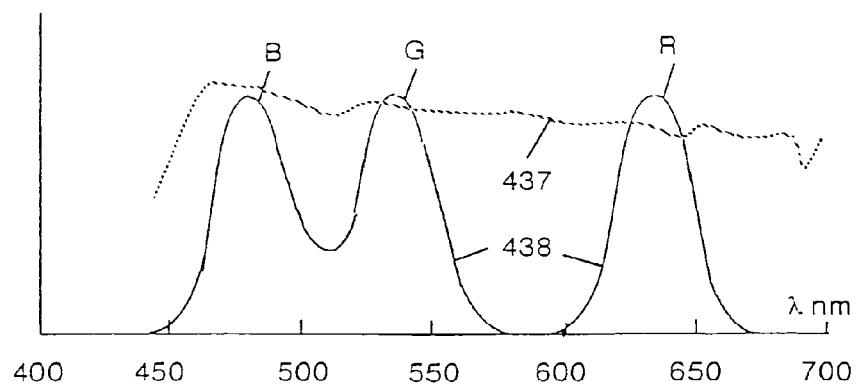
FIG. 30 illustrates the spectral distribution of white light produced by an RGB LED lamp.
Figure 31:
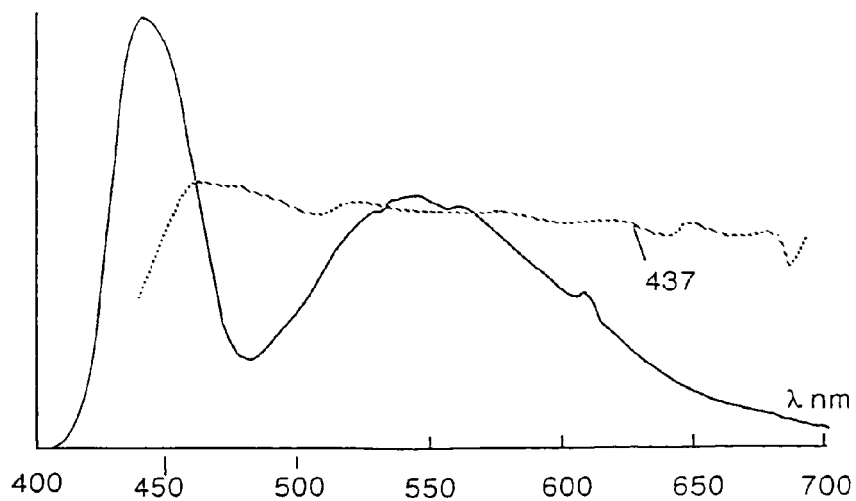
FIG. 31 illustrates the spectral distribution of the white light produced by a prior art GaN violet chip covered with fluorescent material.

The two-chip light sources of FIGS. 20, 22, 28 can be arranged to provide red, amber and green light. In this case chip 200 is arranged for producing green light and chip 300 is arranged to have a wiring scheme as shown in FIG. 29, with the elements in positions 492 fabricated to produce amber light and the elements in positions 493 fabricated to produce red light. Such a two-chip light source can be used in a single-housing traffic light; instead of having three separate housings, one for each of the three colors.

Reflector 403 over core 308 can be of a soft material, such as a rubbery substance, a gel, a grease, or even a liquid. Small spacers can be attached to the bottom of core 208 that define the thickness of layer 403. Cavity filler 314 can be of the same material as reflector 403. If reflector material 403 is too soft for laminating wafers it can be applied to chip pairs instead of to wafer pairs. Using a soft material to join structures 200, 300 together reduces stresses in the structures caused by their having different thermal expansion coefficients.

Trenches can be formed in the semiconductor cores using a floating rotary diamond-tipped saw. The saw perimeter is profiled to provide the desired shape for the cavity. The floating arrangement can include a shoe that slides on the wafer top surface during cutting of the trench, the shoe being attached to the housing or axle-bearing of the saw, thus ensuring that the depth of the cut, measured from the top surface of the wafer, is accurate even if the wafer thickness varies or the wafer is warped. The machining operations provided by the floating saw can be carried out both for cutting a groove in the semiconductor and for subsequently shaping metal that is deposited in the groove.

In the various cavity arrangements that have been discussed, the cavity may have fillets at the junctions of the floors with the side walls, so as to reduce mechanical stresses in the semiconductor. Reflector 316 may have on each of its two sides a single reflective surface with a curved concave cross-section, instead of two flat surfaces. The same is true of the reflector of FIG. 4. The cross-section can have a radius that is about equal to the height of the reflector.

Various features that have already been described in relation to the chips of FIGS. 2, 5, such as for example the provision of series connections and fuses for the elements E or TE, can be incorporated in structures 200, 300.

What is claimed is:

1. A light source, comprising:
   a semiconductor core comprising:
      a top surface;
      a lower surface; and
      an active region arranged between the top surface and the lower surface, and configured to generate light with a wavelength;
   a first inner terminal electrically connected to the semiconductor core;
   one or more first conductors connected to the first inner terminal;
   a first outer terminal having at least two outer surfaces, and electrically connected to the first inner terminal;
   a first translucent material arranged on the top surface, and exposing the at least two outer surfaces; and
   a glass sheet arranged on the lower surface.

2. The light source of claim 1, further comprising a second translucent material arranged on the lower surface, and having a thickness greater than the wavelength.

3. The light source of claim 2, wherein the second translucent material is wider than the semiconductor core.

4. The light source of claim 1, further comprising a lens arranged on the lower surface.

5. The light source of claim 1, further comprising a reflective surface arranged on the top surface, and configured to reflect the light passing through the semiconductor core.

6. The light source of claim 1, wherein the semiconductor core further comprises a second conductor arranged on the one or more first conductors.

7. The light source of claim 6, wherein the semiconductor core further comprises insulation arranged between the one or more first conductors and the second conductor.

8. A light source, comprising:
   a semiconductor core comprising:
      a top surface;
      a lower surface; and
      an active region arranged between the top surface and the lower surface, and configured to generate light with a wavelength;
   a first inner terminal electrically connected to the semiconductor core;
   a metallic track passing though the active region and not exceeding the lower surface;
   a first outer terminal having at least two outer surfaces, and electrically connected to the first inner terminal;
   a first translucent material arranged on the top surface, and exposing the at least two outer surfaces; and
   a glass sheet arranged on the lower surface.

9. The light source of claim 8, further comprising a second translucent material arranged on the lower surface, and having a thickness greater than the wavelength.

10. The light source of claim 8, wherein the second translucent material is wider than the semiconductor core.

11. The light source of claim 8, further comprising a lens arranged on the lower surface.

12. The light source of claim 8, further comprising a reflective surface arranged on the top surface, and configured to reflect the light passing through the semiconductor core.

13. The light source of claim 8, wherein the semiconductor core further comprises an insulator between the metallic track and the active region.

14. The light source of claim 8, wherein the semiconductor core further comprises insulation arranged between the first translucent material and the top surface.

15. A light source, comprising:
   a semiconductor core comprising:
      a top surface;
      a lower surface; and
      an active region arranged between the top surface and the lower surface, and configured to generate light with a wavelength;
   a first inner terminal electrically connected to the semiconductor core;
   a second inner terminal electrically connected to the semiconductor core;
   a first outer terminal having at least two first outer surfaces, and electrically connected to the first inner terminal;
   a second outer terminal having at least two second outer surfaces, and electrically connected to the second inner terminal;
   a first translucent material arranged on the top surface, and exposing the at least two first outer surfaces and the at least two second outer surfaces; and
   a second translucent material arranged on the lower surface, and having a thickness greater than the wavelength.

16. The light source of claim 15, further comprising a glass sheet arranged on the lower surface.

17. The light source of claim 16, wherein the second translucent material is wider than the semiconductor core.

18. The light source of claim 15, further comprising a lens arranged on the lower surface.

19. The light source of claim 15, further comprising a reflective surface arranged on the top surface, and configured to reflect the light passing through the semiconductor core.

20. The light source of claim 15, wherein the semiconductor core further comprises insulation arranged between the first translucent material and the top surface.

* * * * *